(12) United States Patent
Yamazaki et al.

(10) Patent No.: US 9,166,055 B2
(45) Date of Patent: *Oct. 20, 2015

(54) SEMICONDUCTOR DEVICE AND METHOD FOR MANUFACTURING THE SAME

(75) Inventors: Shunpei Yamazaki, Tokyo (JP); Tatsuya Honda, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/495,297

(22) Filed: Jun. 13, 2012

(65) Prior Publication Data

US 2012/0319114 A1 Dec. 20, 2012

(30) Foreign Application Priority Data

Jun. 17, 2011 (JP) ................................. 2011-135355

(51) Int. Cl.
*H01L 29/786* (2006.01)

(52) U.S. Cl.
CPC ...... *H01L 29/78618* (2013.01); *H01L 29/7869* (2013.01); *H01L 29/78696* (2013.01)

(58) Field of Classification Search
USPC .......................................................... 257/43
IPC .................................................. H01L 29/7869
See application file for complete search history.

(56) References Cited

U.S. PATENT DOCUMENTS

| | | | |
|---|---|---|---|
| 4,065,781 A * | 12/1977 | Gutknecht | ...................... 257/66 |
| 5,528,032 A | 6/1996 | Uchiyama | |
| 5,731,856 A | 3/1998 | Kim et al. | |
| 5,744,864 A | 4/1998 | Cillessen et al. | |
| 5,929,467 A * | 7/1999 | Kawai et al. | ................... 257/192 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |

(Continued)

FOREIGN PATENT DOCUMENTS

| | | |
|---|---|---|
| CN | 101057339 A | 10/2007 |
| CN | 102245531 A | 11/2011 |

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Eugene Lee
(74) *Attorney, Agent, or Firm* — Eric J. Robinson; Robinson Intellectual Property Law Office, P.C.

(57) ABSTRACT

A transistor including an oxide semiconductor layer and having electric characteristics required depending on an intended use, and a semiconductor device including the transistor are provided. In a transistor in which a semiconductor layer, a source electrode layer and a drain electrode layer, a gate insulating film, and a gate electrode layer are stacked in this order over an oxide insulating film, an oxide semiconductor stack composed of at least two oxide semiconductor layers having different energy gaps is used as the semiconductor layer. Oxygen and/or a dopant may be introduced into the oxide semiconductor stack.

16 Claims, 14 Drawing Sheets

(56) References Cited

U.S. PATENT DOCUMENTS

| | | | |
|---|---|---|---|
| 6,838,308 B2 * | 1/2005 | Haga | 438/104 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 * | 9/2006 | Nause et al. | 257/192 |
| 7,211,825 B2 | 5/2007 | Shih et al. | |
| 7,265,421 B2 * | 9/2007 | Madurawe | 257/348 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,432,526 B2 * | 10/2008 | Van de Walle et al. | 257/43 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,994,500 B2 | 8/2011 | Kim et al. | |
| 8,058,645 B2 | 11/2011 | Jeong et al. | |
| 8,148,779 B2 | 4/2012 | Jeong et al. | |
| 8,188,480 B2 | 5/2012 | Itai | |
| 8,193,045 B2 * | 6/2012 | Omura et al. | 438/151 |
| 8,202,365 B2 | 6/2012 | Umeda et al. | |
| 8,203,143 B2 | 6/2012 | Imai | |
| 8,253,134 B2 * | 8/2012 | Kim et al. | 257/43 |
| 8,274,078 B2 | 9/2012 | Itagaki et al. | |
| 8,502,221 B2 | 8/2013 | Yamazaki | |
| 8,753,548 B2 | 6/2014 | Yano et al. | |
| 8,871,119 B2 | 10/2014 | Yano et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0237598 A1 | 10/2008 | Nakayama | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308804 A1 | 12/2008 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0278122 A1 | 11/2009 | Hosono et al. | |
| 2009/0280600 A1 | 11/2009 | Hosono et al. | |
| 2010/0006834 A1 * | 1/2010 | Kim et al. | 257/43 |
| 2010/0065844 A1 | 3/2010 | Tokunaga | |
| 2010/0084648 A1 | 4/2010 | Watanabe | |
| 2010/0092800 A1 | 4/2010 | Itagaki et al. | |
| 2010/0109002 A1 | 5/2010 | Itagaki et al. | |
| 2010/0320458 A1 | 12/2010 | Umeda et al. | |
| 2010/0320459 A1 | 12/2010 | Umeda et al. | |
| 2011/0024751 A1 | 2/2011 | Yamazaki et al. | |
| 2011/0127523 A1 | 6/2011 | Yamazaki | |
| 2011/0193083 A1 | 8/2011 | Kim et al. | |
| 2011/0215328 A1 | 9/2011 | Morosawa et al. | |
| 2011/0240990 A1 | 10/2011 | Yamazaki | |
| 2011/0240991 A1 | 10/2011 | Yamazaki | |
| 2011/0240992 A1 | 10/2011 | Yamazaki | |
| 2011/0240993 A1 | 10/2011 | Yamazaki | |
| 2011/0240994 A1 | 10/2011 | Yamazaki | |
| 2011/0240995 A1 | 10/2011 | Yamazaki | |
| 2011/0248260 A1 | 10/2011 | Yamazaki | |
| 2011/0260121 A1 | 10/2011 | Yano et al. | |
| 2012/0119205 A1 | 5/2012 | Taniguchi et al. | |
| 2012/0319102 A1 | 12/2012 | Yamazaki et al. | |
| 2012/0319183 A1 | 12/2012 | Yamazaki et al. | |
| 2013/0009209 A1 | 1/2013 | Yamazaki | |
| 2013/0277672 A1 | 10/2013 | Sano et al. | |

FOREIGN PATENT DOCUMENTS

| | | |
|---|---|---|
| EP | 1737044 A | 12/2006 |
| EP | 2226847 A | 9/2010 |
| EP | 2453480 A | 5/2012 |
| EP | 2453481 A | 5/2012 |
| EP | 2455975 A | 5/2012 |
| GB | 2 153 589 | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |

(56) References Cited

FOREIGN PATENT DOCUMENTS

| JP | 2002-289859 A | 10/2002 |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2006-165529 A | 6/2006 |
| JP | 2007-096055 A | 4/2007 |
| JP | 2007-123861 A | 5/2007 |
| JP | 2009-231613 | 10/2009 |
| JP | 2010-016347 | 1/2010 |
| JP | 4415062 | 2/2010 |
| JP | 2010-067954 | 3/2010 |
| JP | 2010-177431 | 8/2010 |
| JP | 2010-177431 A | 8/2010 |
| JP | 4571221 | 10/2010 |
| JP | 2011-135063 A | 7/2011 |
| JP | 2012-160679 A | 8/2012 |
| JP | 2012-180274 A | 9/2012 |
| KR | 2007-0090182 A | 9/2007 |
| KR | 2011-0095311 A | 8/2011 |
| KR | 2012-0103616 A | 9/2012 |
| TW | 201029952 | 8/2010 |
| TW | 201138111 | 11/2011 |
| WO | WO-2004/114391 | 12/2004 |
| WO | WO-2006/051993 | 5/2006 |
| WO | WO2008/133345 | 11/2008 |
| WO | WO 2009/072532 | 6/2009 |
| WO | WO-2010/067571 | 6/2010 |
| WO | WO-2011/065243 | 6/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Morosawa et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

Ono et al., "Novel High Performance IGZO-TFT with High Mobility over 40 cm$^2$/Vs and High Photostability Incorporated Oxygen Diffusion," IDW '11: Proceedings of the 18$^{th}$ International Display Workshops, Dec. 7, 2011, pp. 1689-1690.

* cited by examiner

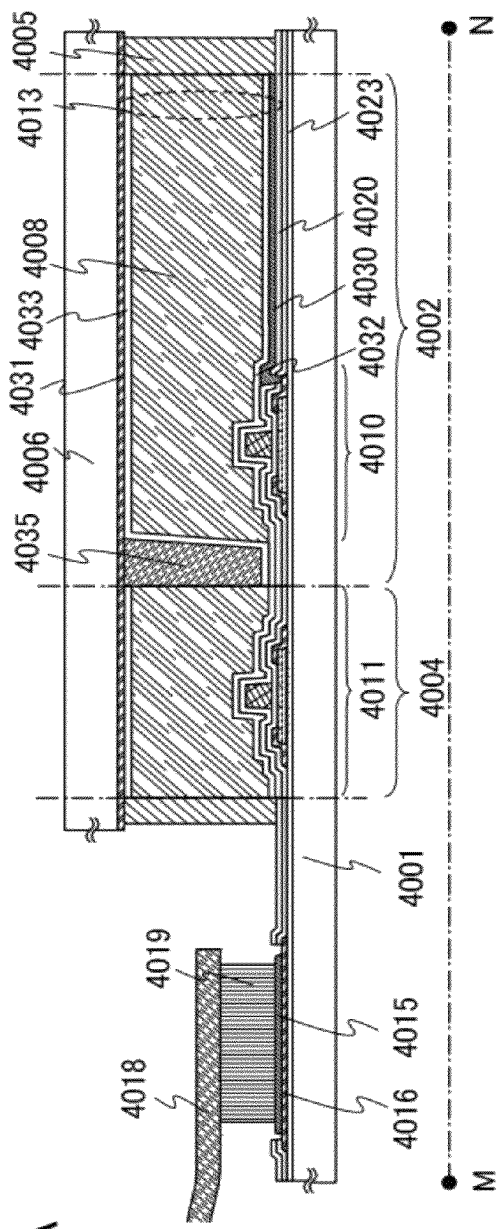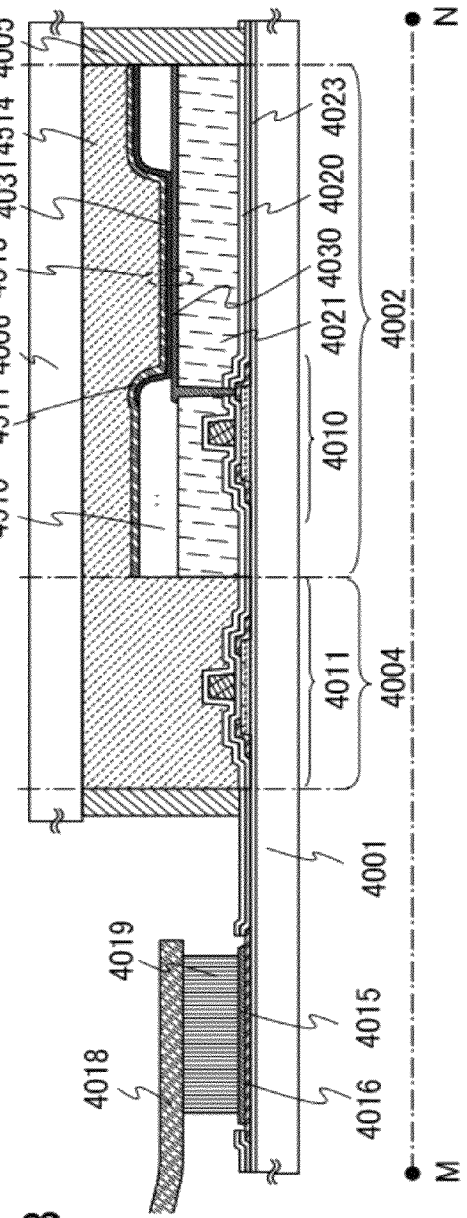
FIG. 8A
FIG. 8B

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a semiconductor device means any device which can function by utilizing semiconductor characteristics, and an electro-optical device, a semiconductor circuit, and an electronic device are all included in the category of the semiconductor device.

2. Description of the Related Art

Attention has been focused on a technique for forming a transistor using a semiconductor thin film (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

A transistor including an oxide semiconductor is required to have excellent electric characteristics for application to semiconductor devices with higher performance. In order to achieve excellent electric characteristics of the transistor including an oxide semiconductor, a technique in which low resistance source and drain regions by an aluminum reaction method has been reported (e.g., see Non-Patent Document 1).

For example, a transistor whose active layer includes an amorphous oxide including indium (In), gallium (Ga), and zinc (Zn) is disclosed (see Patent Document 1).

REFERENCE

Patent Document

[Patent Document 1] Japanese Published Patent Application No. 2006-165528

Non-Patent Document

N. Morosawa, Yoshihiro Ohshima, Mitsuo Morooka, Toshiaki Arai, Tatsuya Sasaoka, "A Novel Self-Aligned Top-Gate Oxide TFT for AM-OLED Displays", SID 11 DIGEST pp. 479-482

SUMMARY OF THE INVENTION

An improvement in the on-state characteristics (e.g., on-state current and field effect mobility) of a transistor leads to quick response to an input signal and high-speed operation of a semiconductor device; thus, a semiconductor device with higher performance can be achieved. On the other hand, a sufficiently low off-state current is needed to reduce power consumption of a semiconductor device. That is, required electric characteristics of a transistor vary with uses and purposes of the transistor, and it is profitable to control the electric characteristics more accurately.

An object of one embodiment of the present invention is to provide a structure of a transistor and a method for manufacturing the transistor. In the transistor, an oxide semiconductor is used for a channel formation region, and the threshold voltage, which is one of the electric characteristics of a transistor, can be positive, so that the transistor can serve as a so-called normally-off switching element.

It is preferable that a channel be formed at a threshold voltage at which the gate voltage is a positive threshold voltage as close to 0 V as possible in a transistor. If the threshold voltage of the transistor is negative, the transistor tends to be in a so-called normally-on state, in which current flows between the source electrode and the drain electrode even when the gate voltage is 0 V. For an LSI, a CPU, or a memory, electric characteristics of transistors included in a circuit are significant and power consumption of a semiconductor device depends on the electric characteristics. In particular, of the electric characteristics of the transistor, the threshold voltage ($V_{th}$) is important. When the threshold voltage is negative even when the field effect mobility is high, it is difficult to control as the circuit. Such a transistor in which a channel is formed and a drain current flows even at a negative voltage is not suitable as a transistor used in an integrated circuit of a semiconductor device.

Further, it is important that the characteristics of a transistor be close to the normally-off characteristics even when the transistor is not a normally-off transistor depending on theist material or manufacturing condition. Another object of one embodiment of the present invention is to provide a structure for achieving a threshold voltage of a transistor close to zero even when the threshold voltage is negative, that is, even when the transistor is a so-called normally-on transistor, and to provide a manufacturing method thereof.

Another object of one embodiment of the present invention is to provide a structure of a semiconductor device which achieves quick response and high-speed operation by improving on-state characteristics of a transistor (e.g., on-state current or field-effect mobility), and to provide a manufacturing method thereof, in order to achieve a high-performance semiconductor device.

Another object of one embodiment of the present invention is to provide a transistor including an oxide semiconductor layer and having electric characteristics required depending on an intended use, and to provide a semiconductor device including the transistor.

In a transistor in which a semiconductor layer, a source electrode layer and a drain electrode layer, a gate insulating film, and a gate electrode layer are stacked in this order, an oxide semiconductor stack composed of at least two oxide semiconductor layers having different energy gaps is used as the semiconductor layer.

In the case where the oxide semiconductor stack is composed of a first oxide semiconductor layer and a second oxide semiconductor layer, the energy gaps of the first oxide semiconductor layer and the second oxide semiconductor layer are different from each other, and the stack order thereof is not limited. One of the oxide semiconductor layers which is in contact with the gate insulating film may have either a larger energy gap or a smaller energy gap than the other.

Specifically, the energy gap of one oxide semiconductor layer in the oxide semiconductor stack is 3 eV or larger, and the energy gap of the other oxide semiconductor layer is smaller than 3 eV. Note that in this specification, the term "energy gap" is used to mean the terms "band gap" and "forbidden band gap".

In the case where the oxide semiconductor stack is composed of three or more oxide semiconductor layers, all the oxide semiconductor layers may have different energy gaps from one another, or some of oxide semiconductor layers in the oxide semiconductor stack may have substantially the same energy gap.

For example, in an oxide semiconductor stack composed of a first oxide semiconductor layer, a second oxide semiconductor layer, and a third oxide semiconductor layer, the energy gap of the second oxide semiconductor layer is set to be smaller than the energy gaps of the first oxide semiconductor layer and the third oxide semiconductor layer. Alternatively, the electron affinity of the second oxide semiconductor layer is set to be larger than the electron affinities of the first oxide semiconductor layer and the third oxide semiconductor layer. In that case, the first oxide semiconductor layer and the third oxide semiconductor layer can have the same energy gap and the same electron affinity. The second oxide semiconductor layer with a small energy gap is sandwiched between the first oxide semiconductor layer with a large energy gap and the third oxide semiconductor layer with a large energy gap. With such a structure of an oxide semiconductor stack, an effect of reducing the off-state current (leakage current) of a transistor can be obtained. Here, the electron affinity means an energy gap between a vacuum level and a conduction band of an oxide semiconductor.

In a transistor including an oxide semiconductor layer, the energy gap of the oxide semiconductor layer has an influence on electric characteristics of the transistor. For example, in a transistor including an oxide semiconductor layer which has a small energy gap, on-state characteristics (e.g., on-state current or field-effect mobility) are improved. On the other hand, in a transistor including an oxide semiconductor layer which has a large energy gap, the off-state current can be decreased.

With a single oxide semiconductor layer, electric characteristics of a transistor are almost determined by the energy gap of the oxide semiconductor layer; thus, it is difficult that the transistor has desired electric characteristics.

An oxide semiconductor stack is composed of a plurality of oxide semiconductor layers having different energy gaps, whereby electric characteristics of the transistor can be accurately controlled; accordingly, desired electric characteristics can be given to the transistor.

Therefore, a semiconductor device which meets various purposes such as high performance, high reliability, and low power consumption can be provided.

One embodiment of the invention disclosed in this specification is a semiconductor device including an oxide semiconductor stack including a first oxide semiconductor layer and a second oxide semiconductor layer whose energy gaps are different from each other, a source electrode layer and a drain electrode layer over the oxide semiconductor stack, a gate insulating film over the source electrode layer and the drain electrode layer, and a gate electrode layer provided over the gate insulating film to overlap with the oxide semiconductor stack.

One embodiment of the invention disclosed in this specification is a semiconductor device including an oxide semiconductor stack including a first oxide semiconductor layer, a second oxide semiconductor layer, and a third oxide semiconductor layer in this order, a source electrode layer and a drain electrode layer over the oxide semiconductor stack, a gate insulating film over the source electrode layer and the drain electrode layer, and a gate electrode layer provided over the gate insulating film to overlap with the oxide semiconductor stack. In the semiconductor device, the energy gap of the second oxide semiconductor layer is smaller than the energy gaps of the first oxide semiconductor layer and the third oxide semiconductor layer.

In the above structure, the oxide semiconductor stack has an island shape, and the source electrode layer and the drain electrode layer can be formed in contact with the side surfaces (end portions) of the oxide semiconductor stack. In that case, the side surfaces (end portions) of the first oxide semiconductor layer, the second oxide semiconductor layer, and the third oxide semiconductor layer are exposed at the side surfaces (end portions) of the oxide semiconductor stack; thus, the first oxide semiconductor layer, the second oxide semiconductor layer, and the third oxide semiconductor layer are in contact with the source electrode layer and the drain electrode layer.

One embodiment of the invention disclosed in this specification is a method for manufacturing a semiconductor device, including the steps of forming an oxide semiconductor stack including two oxide semiconductor layers having different energy gaps over an oxide insulating film, forming a source electrode layer and a drain electrode layer over the oxide semiconductor stack, forming a gate insulating film covering the source electrode layer and the drain electrode layer, and forming a gate electrode layer over the gate insulating film.

One embodiment of the invention disclosed in this specification is a method for manufacturing a semiconductor device, including the steps of stacking oxide semiconductor films having different energy gaps over an oxide insulating film, forming a mask over the stack of oxide semiconductor films, etching the stack of oxide semiconductor films with use of the mask to form an oxide semiconductor stack, forming a source electrode layer and a drain electrode layer over the oxide semiconductor stack, forming a gate insulating film covering the source electrode layer and the drain electrode layer, and forming a gate electrode layer over the gate insulating film.

Furthermore, a dopant may be introduced into the oxide semiconductor stack with the use of the gate electrode layer as a mask so that low resistance regions containing a dopant are formed in a self-aligned manner. The low resistance regions have lower resistance than a channel formation region in the oxide semiconductor stack, and the channel formation region is sandwiched between the low resistance regions. A dopant is an impurity with which the conductivity of the oxide semiconductor stack is changed. As a method for introducing a dopant, an ion implantation method, an ion doping method, a plasma immersion ion implantation method, or the like can be used.

With an oxide semiconductor stack which includes low-resistance regions between which a channel formation region is sandwiched in the channel length direction, the transistor has excellent on-state characteristics (e.g., on-state current and field-effect mobility) and enables high-speed operation and quick response.

Further, heat treatment (dehydration or dehydrogenation treatment) by which hydrogen or moisture is eliminated may be performed on the stoxide semiconductor layer (the oxide semiconductor film). For example, it is preferable that heat treatment be performed on the stack of oxide semiconductor films before the mask is formed to eliminate hydrogen or moisture included therein.

The dehydration or dehydrogenation treatment may accompany elimination of oxygen which is a main component material for an oxide semiconductor, whereby oxygen in the oxide semiconductor films is reduced. Oxygen vacancy exists in a portion where oxygen is eliminated in an oxide semiconductor film, and a donor level which leads to a change in the electric characteristics of a transistor is formed owing to the oxygen vacancy.

Accordingly, oxygen is preferably supplied to the oxide semiconductor layer (oxide semiconductor film) which has been subjected to dehydration or dehydrogenation treatment. By supply of oxygen to the oxide semiconductor layer (oxide semiconductor film), oxygen vacancy in the film can be filled.

For example, an oxide insulating film containing much (excessive) oxygen, which serves as an oxygen supply source, is provided so as to be in contact with the oxide semiconductor layer (oxide semiconductor film), whereby oxygen can be supplied to the oxide semiconductor layer (oxide semiconductor film) from the oxide insulating film. In the above structure, heat treatment may be performed in the state where the oxide semiconductor layer (oxide semiconductor film) which has been subjected to the heat treatment and the oxide insulating film are in contact with each other at least partly to supply oxygen to the oxide semiconductor layer (oxide semiconductor film).

Further or alternatively, oxygen (which includes at least any of an oxygen radical, an oxygen atom, and an oxygen ion) may be introduced into the oxide semiconductor layer (oxide semiconductor film) which has been subjected to dehydration or dehydrogenation treatment to supply oxygen to the oxide semiconductor film. As the method for introduction of oxygen, an ion implantation method, an ion doping method, a plasma immersion ion implantation method, plasma treatment, or the like can be used.

Further, it is preferable that the oxide semiconductor layer (oxide semiconductor film) in the transistor include a region where the oxygen content is higher than that in the stoichiometric ratio of the oxide semiconductor in a crystalline state. In that case, the oxygen content is higher than that in the stoichiometric ratio of the oxide semiconductor. Alternatively, the oxygen content is higher than that of the oxide semiconductor in a single crystal state. In some cases, oxygen exists between lattices of the oxide semiconductor.

By removing hydrogen or moisture from the oxide semiconductor to highly purify the oxide semiconductor so as not to contain impurities as much as possible, and supplying oxygen to fill oxygen vacancy therein, the oxide semiconductor can be turned into an i-type (intrinsic) oxide semiconductor or a substantially i-type (intrinsic) oxide semiconductor. Accordingly, the Fermi level (Ef) of the oxide semiconductor can be changed to the same level as the intrinsic Fermi level (Ei). Thus, by using the oxide semiconductor film for a transistor, variation in the threshold voltage Vth of the transistor due to the oxygen vacancy and a shift of the threshold voltage ΔVth can be reduced.

One embodiment of the present invention relates to a semiconductor device including a transistor or a semiconductor device including a circuit including the transistor. For example, one embodiment of the present invention relates to a semiconductor device including a transistor in which an oxide semiconductor is used for a channel formation region or a semiconductor device including a circuit which is formed with the use of such a transistor. For example, one embodiment of the present invention relates to an electronic device which includes, as a component, a semiconductor integrated circuit such as an LSI, a CPU, a power device mounted in a power circuit, a memory, a thyristor, a converter, or an image sensor, or a light-emitting display device including a light-emitting element or an electro-optical device typified by a liquid crystal display panel.

An oxide semiconductor stack includes a plurality of oxide semiconductor layers having different energy gaps, whereby electric characteristics of the transistor can be accurately controlled; accordingly, desired electric characteristics can be given to the transistor.

Therefore, a semiconductor device which meets various purposes such as high performance, high reliability, and low power consumption can be provided.

BRIEF DESCRIPTION OF THE DRAWINGS

In the accompanying drawings:

FIGS. 8A and 8B each illustrate one mode of a semiconductor device;

DETAILED DESCRIPTION OF THE INVENTION

Hereinafter, embodiments of the invention disclosed in this specification will be described in detail with reference to the accompanying drawings. However, the invention disclosed in this specification is not limited to the description below, and it is easily understood by those skilled in the art that modes and details disclosed herein can be modified in various ways. Therefore, the invention disclosed in this specification should not be interpreted as being limited to the descriptions of the embodiments below. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, modes of semiconductor devices and a method for manufacturing the semiconductor device are described with reference to FIGS. 1A and 1B, FIGS. 2A to 2E, and FIGS. 3A to 3C. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
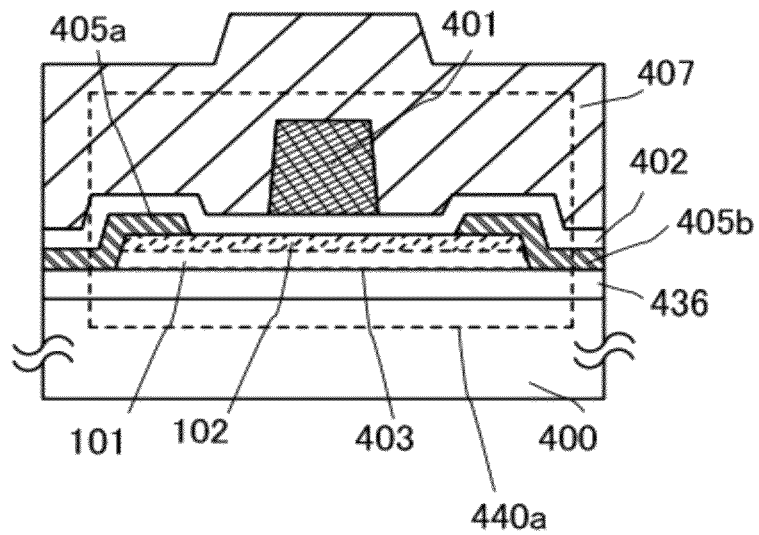
FIGS. 1A and 1B each illustrate one mode of a semiconductor device.
Figure 1B:
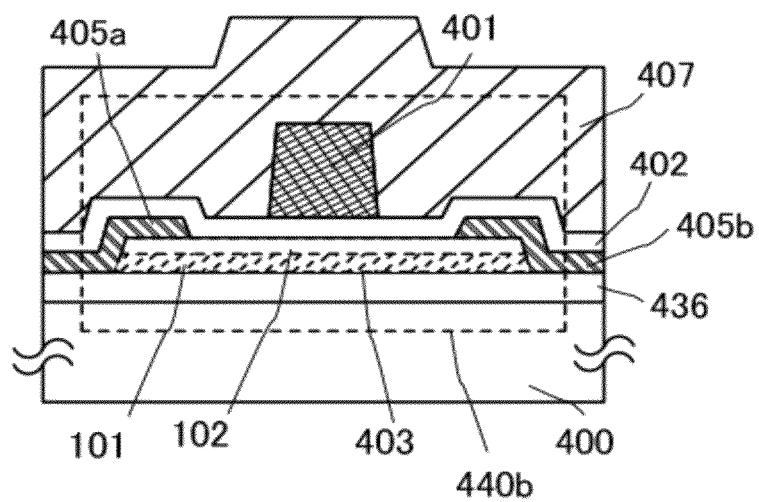

A transistor 440a in FIG. 1A and a transistor 440b in FIG. 1B are examples of planar type transistors having a top-gate structure.

As illustrated in FIGS. 1A and 1B, the transistors 440a and 440b each include, over a substrate 400 provided with an oxide insulating film 436, an oxide semiconductor stack 403 composed of a first oxide semiconductor layer 101 and a second oxide semiconductor layer 102 which have different energy gaps, a source electrode layer 405a, a drain electrode layer 405b, a gate insulating film 402, and a gate electrode layer 401. Over the transistors 440a and 440b, an insulating film 407 is formed.

Note that in FIGS. 1A and 1B, an interface between the first oxide semiconductor layer 101 and the second oxide semiconductor layer 102 is shown with a dotted line that schematically shows the oxide semiconductor stack 403. The interface between the first oxide semiconductor layer 101 and the second oxide semiconductor layer 102 is not clear in some cases depending on a material, film formation conditions, and/or heat treatment. In the case where the interface is unclear, a portion which can be called mixed region or mixed layer of a plurality of oxide semiconductor layers is formed in some cases. The same applies to the other drawings of this specification.

In the oxide semiconductor stack 403, the first oxide semiconductor layer 101 and the second oxide semiconductor layer 102 have different energy gaps and the stack order thereof is not limited.

Specifically, the energy gap of one oxide semiconductor layer in the oxide semiconductor stack 403 is larger than or equal to 3 eV, and the energy gap of the other oxide semiconductor layer is smaller than 3 eV.

The transistor 440a in FIG. 1A is an example of a transistor in which the second oxide semiconductor layer 102 has a larger energy gap than the first oxide semiconductor layer 101. In this embodiment, an In—Sn—Zn-based oxide film (energy gap: 2.6 eV to 2.9 eV, typically 2.8 eV) is used as the first oxide semiconductor layer 101, and an In—Ga—Zn-based oxide (also referred to as IGZO) film (energy gap: 3.0 eV to 3.4 eV, typically 3.2 eV) is used as the second oxide semiconductor layer 102 in the transistor 440a.

In contrast, the transistor 440b in FIG. 1B is an example of a transistor in which the second oxide semiconductor layer 102 has a smaller energy gap than the first oxide semiconductor layer 101. In this embodiment, an In—Ga—Zn-based oxide film (energy gap: 3.2 eV) is used as the first oxide semiconductor layer 101, and an In—Sn—Zn-based oxide film (energy gap: 2.8 eV) is used as the second oxide semiconductor layer 102 in the transistor 440b.

As described above, as for the first oxide semiconductor layer 101 and the second oxide semiconductor layer 102 in the oxide semiconductor stack 403, one of the layer which is in contact with the gate insulating film 402 may have either a larger energy gap or a smaller energy gap than the other.

Figure 4A:
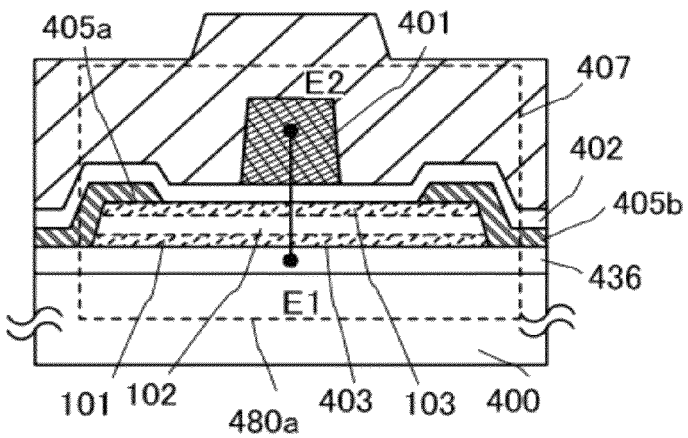
FIGS. 4A and 4B each illustrate one mode of a semiconductor device and FIG. 4C is an energy band diagram of FIG. 4A.

FIG. 4A illustrates a transistor 480a in which the oxide semiconductor stack 403 is composed of three layers: the first oxide semiconductor layer 101, the second oxide semiconductor layer 102, and a third oxide semiconductor layer 103.

The transistor 480a includes, over the substrate 400 provided with the oxide insulating film 436, the oxide semiconductor stack 403 composed of the first oxide semiconductor layer 101, the second oxide semiconductor layer 102, and the third oxide semiconductor layer 103, the source electrode layer 405a, the drain electrode layer 405b, the gate insulating film 402, and the gate electrode layer 401. Over the transistor 480a, the insulating film 407 is formed.

Figure 4C:
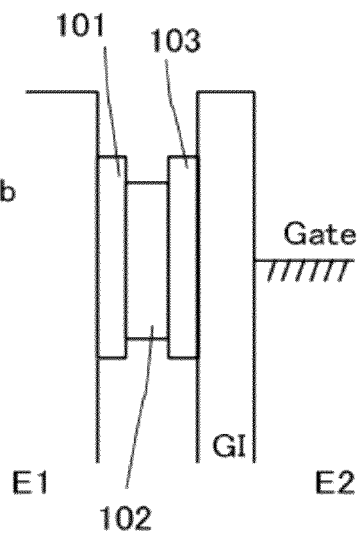
Figure 4B:
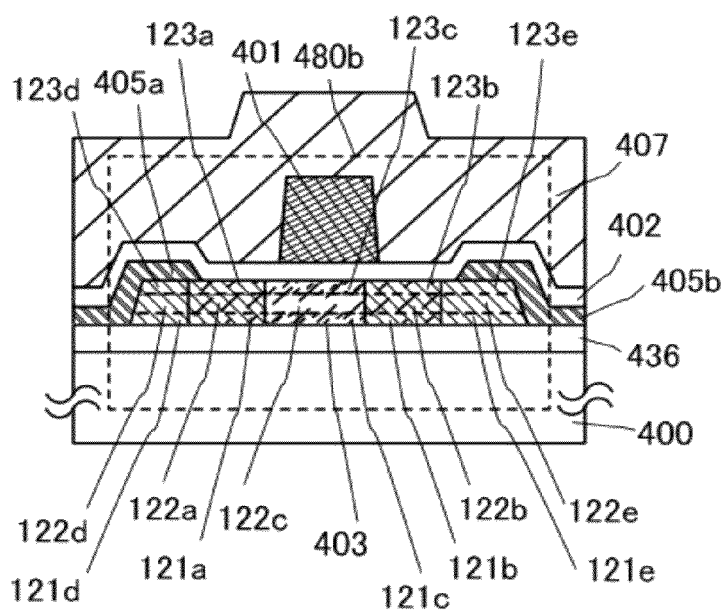

Note that in FIGS. 4A to 4C, an interface between the first oxide semiconductor layer 101 and the second oxide semiconductor layer 102 is shown with a dotted line that schematically shows the oxide semiconductor stack 403. The interface between the first oxide semiconductor layer 101 and the second oxide semiconductor layer 102 is not clear in some cases depending on a material, film formation conditions, and/or heat treatment. In the case where the interface is unclear, a portion which can be called mixed region or mixed layer including a plurality of oxide semiconductor layers which are different from each other is formed in some cases. Note that likewise, an interface between the second oxide semiconductor layer 102 and the third oxide semiconductor layer 103 is shown with a dotted line.

In the oxide semiconductor stack 403 in the transistor 480a, not all the energy gaps of the first oxide semiconductor layer 101, the second oxide semiconductor layer 102, and the third oxide semiconductor layer 103 are the same, and the layers have at least two different energy gaps.

In the case where the oxide semiconductor stack 403 is composed of three or more layers, all the oxide semiconductor layers may have different energy gaps from one another, or some of oxide semiconductor layers in the oxide semiconductor stack 403 may have substantially the same energy gap.

An oxide semiconductor used for the oxide semiconductor stack 403 (the first oxide semiconductor layer 101, the second oxide semiconductor layer 102, and the third oxide semiconductor layer 103) preferably contains at least indium (In) or zinc (Zn). In particular, In and Zn are preferably contained. In addition, as a stabilizer for reducing the variation in electric characteristics of a transistor using the oxide, it is preferable that gallium (Ga) be further contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: an indium oxide; a tin oxide; a zinc oxide; a two-component metal oxide such as an In—Zn-based oxide, an Sn—Zn-based oxide, an Al—Zn-based oxide, a Zn—Mg-based oxide, an Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, an Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, the In—Ga—Zn-based oxide means an oxide containing In, Ga, and Zn as its main components and there is no particular limitation on the ratio of In:Ga:Zn. The In—Ga—Zn-based oxide may further include a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3) or 2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), 2:1:3 (=1/3:1/6:1/2), or 2:1:5 (=1/4:1/8:5/8), or any of oxides whose composition is in the neighborhood of the above compositions can be used.

However, without limitation to the materials given above, a material with an appropriate composition may be used depending on requisite semiconductor characteristics (e.g., mobility, threshold voltage, and variation). To obtain requisite semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily with an In—Sn—Zn-based oxide. However, mobility can be increased by reducing the defect density in the bulk also with an In—Ga—Zn-based oxide.

For example, the "composition of an oxide containing In, Ga, and Zn at the atomic ratio, In:Ga:Zn=a:b:c(a+b+c=1), is in the neighborhood of the composition of an oxide containing In, Ga, and Zn at the atomic ratio, In:Ga:Zn=A:B:C(A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease; therefore, interface scattering of a transistor including the amorphous oxide semiconductor can be reduced, so that relatively high mobility can be obtained with relative ease.

In an oxide semiconductor having crystallinity, defects in the bulk can be more reduced, and mobility higher than that of the amorphous oxide semiconductor can be obtained by improving the surface flatness. To improve the surface flatness, the oxide semiconductor is preferably formed on a flat surface. Specifically, the oxide semiconductor may be formed on a surface with the average surface roughness (Ra) of less than or equal to 1 nm, preferably less than or equal to 0.3 nm, further preferably less than or equal to 0.1 nm.

The average surface roughness Ra is obtained by three-dimension expansion of center line average roughness that is defined by JIS B0601 so as to be applied to a plane, and can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x,y) - Z_0| dx dy \qquad \text{[Formula 1]}$$

In the above formula, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents the average height of the measurement surface. The average surface roughness Ra can be measured with an atomic force microscope (AFM).

As the first oxide semiconductor layer 101, the second oxide semiconductor layer 102, and the third oxide semiconductor layer 103 in the oxide semiconductor stack 403, an oxide semiconductor layer which includes crystals and which has crystallinity (crystalline oxide semiconductor layer) can be used. The crystals in the crystalline oxide semiconductor layer may have crystal axes oriented in random directions or in a certain direction.

For example, as the crystalline oxide semiconductor layer, an oxide semiconductor layer including a crystal having a c-axis substantially perpendicular to a surface can be used.

The oxide semiconductor layer including a crystal having a c-axis substantially perpendicular to a surface has neither a single crystal structure nor an amorphous structure and is a c-axis aligned crystalline oxide semiconductor (also referred to as CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

There are three methods for obtaining a CAAC-OS film. The first is a method in which an oxide semiconductor film is deposited at a temperature(s) higher than or equal to 200° C. and lower than or equal to 500° C. such that the c-axis is substantially perpendicular to the top surface. The second is a method in which an oxide semiconductor film is deposited thin, and is subjected to heat treatment at a temperature(s) higher than or equal to 200° C. and lower than or equal to 700° C., so that the c-axis is substantially perpendicular to the top surface. The third is a method in which a first-layer oxide semiconductor film is deposited thin, and is subjected to heat treatment at a temperature(s) higher than or equal to 200° C. and lower than or equal to 700° C., and a second-layer oxide semiconductor film is deposited thereover, so that the c-axis is substantially perpendicular to the top surface.

Each of the first oxide semiconductor layer 101, the second oxide semiconductor layer 102, and the third oxide semiconductor layer 103 has a thickness greater than or equal to 1 nm and less than or equal to 100 nm (preferably greater than or equal to 5 nm and less than or equal to 30 nm) and can be formed by a sputtering method, a molecular beam epitaxy (MBE) method, a CVD method, a pulse laser deposition method, an atomic layer deposition (ALD) method, or the like as appropriate. Each of the first oxide semiconductor layer 101, the second oxide semiconductor layer 102, and the third oxide semiconductor layer 103 may be formed with a sputtering apparatus where film formation is performed with surfaces of a plurality of substrates set substantially perpendicular to a surface of a sputtering target, which is a so-called columnar plasma (CP) sputtering system.

In a transistor including an oxide semiconductor layer, the energy gap of the oxide semiconductor layer has an influence on electric characteristics of the transistor. For example, in a transistor including an oxide semiconductor layer which has a small energy gap, on-state characteristics (e.g., on-state current or field-effect mobility) are improved. On the other hand, in a transistor including an oxide semiconductor layer which has a large energy gap, the off-state current can be decreased.

With the use of the oxide semiconductor stack 403 composed of a plurality of oxide semiconductor layers having different energy gaps, electric characteristics of the transistors 440a, 440b, and 480a can be accurately controlled; accordingly, desired electric characteristics can be given to the transistors 440a, 440b, and 480a.

For example, in the oxide semiconductor stack 403 in the transistor 480a illustrated in FIG. 4A, the energy gap of the second oxide semiconductor layer 102 is set to be smaller than the energy gaps of the first oxide semiconductor layer 101 and the third oxide semiconductor layer 103. In that case, the first oxide semiconductor layer 101 and the third oxide semiconductor layer 103 can have substantially the same energy gap.

FIG. 4C is an energy band diagram in the thickness direction (E1-E2) in FIG. 4A. In the transistor 480a, materials for the first oxide semiconductor layer 101, the second oxide semiconductor layer 102, and the third oxide semiconductor layer 103 are preferably selected in order to satisfy the energy band diagram of FIG. 4C. Note that when a buried channel is formed in the conduction band, sufficient effects can be obtained. Thus, an energy band diagram is not necessarily limited to a structure shown in FIG. 4C in which both conduction band and valence band have a depressed portion; for example, a structure in which only conduction band has a depressed portion may be employed.

For example, in the transistor 480a, an In—Ga—Zn-based oxide film (energy gap: 3.2 eV) is used as the first oxide semiconductor layer 101, an In—Sn—Zn-based oxide film (energy gap: 2.8 eV) is used as the second oxide semiconductor layer 102, and an In—Ga—Zn-based oxide film (energy gap: 3.2 eV) is used as the third oxide semiconductor layer 103.

Further, as the oxide semiconductor stack 403 composed of three layers in the transistor 480a, a stack of an In—Ga—Zn-based oxide film serving as the first oxide semiconductor layer 101, an In—Zn-based oxide film serving as the second oxide semiconductor layer 102, and an In—Ga—Zn-based oxide film serving as the third oxide semiconductor layer 103; a stack of a Ga—Zn-based oxide film serving as the first oxide semiconductor layer 101, an In—Sn—Zn-based oxide film serving as the second oxide semiconductor layer 102, and a Ga—Zn-based oxide film serving as the third oxide semiconductor layer 103; or a stack of a Ga—Zn-based oxide film serving as the first oxide semiconductor layer 101, an In—Zn-based oxide film serving as the second oxide semiconductor layer 102, and a Ga—Zn-based oxide film serving as the third oxide semiconductor layer 103 can be used, for example.

With a structure in which the second oxide semiconductor layer 102 is sandwiched between the first oxide semiconductor layer 101 and the third oxide semiconductor layer 103 and has a smaller energy gap than the first oxide semiconductor layer 101 and the third oxide semiconductor layer 103, an effect of reducing the off-state current (leakage current) of the transistor 480a can be obtained.

FIGS. 2A to 2E illustrate an example of a method for manufacturing the transistor 440a.

First, over the substrate 400, the oxide insulating film 436 is formed.

There is no particular limitation on a substrate that can be used as the substrate 400 as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. In order to manufacture a flexible semiconductor device, the transistor 440a including the oxide semiconductor stack 403 may be directly formed over a flexible substrate. Alternatively, the transistor 440a including the oxide semiconductor stack 403 may be formed over a manufacturing substrate, and then, the transistor 440a may be separated and transferred to a flexible substrate. Note that in order to separate the transistor 440a from the manufacturing substrate and transfer it to the flexible substrate, a separation layer may be provided between the manufacturing substrate and the transistor 440a including the oxide semiconductor stack.

The oxide insulating film 436 can be formed by a plasma CVD method, a sputtering method, or the like, using silicon oxide, silicon oxynitride, aluminum oxide, aluminum oxynitride, hafnium oxide, gallium oxide, or a mixed material of any of these materials.

The oxide insulating film 436 may have either a single-layer structure or a stacked structure. In this embodiment, a silicon oxide film formed by a sputtering method is used as the oxide insulating film 436.

Further, a nitride insulating film may be provided between the oxide insulating film 436 and the substrate 400. The nitride insulating film can be formed by a plasma CVD method, a sputtering method, or the like with the use of silicon nitride, silicon nitride oxide, aluminum nitride, or aluminum nitride oxide, or a mixed material of any of these materials.

Figure 2A:
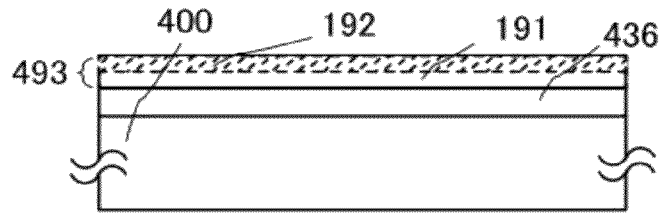
FIGS. 2A to 2E illustrate one mode of a semiconductor device and a method for manufacturing the semiconductor device.

Next, a stack 493 of oxide semiconductor films, which is composed of a first oxide semiconductor film 191 and a second oxide semiconductor film 192, is formed over the oxide insulating film 436 (see FIG. 2A).

The oxide insulating film 436, which is in contact with the stack 493 of oxide semiconductor films (the oxide semiconductor stack 403), preferably contains oxygen which exceeds at least the stoichiometric ratio in the film (the bulk). For example, in the case where a silicon oxide film is used as the oxide insulating film 436, the composition formula is $SiO_{2+\alpha}$ ($\alpha>0$). With such a film as the oxide insulating film 436, oxygen can be supplied to the stack 493 of oxide semiconductor films (the oxide semiconductor stack 403), leading to favorable characteristics. By supply of oxygen to the stack 493 of oxide semiconductor films (the oxide semiconductor stack 403), oxygen vacancy in the film can be filled.

For example, the oxide insulating film 436 containing much (excessive) oxygen, which serves as an oxygen supply source, is provided in contact with the stack 493 of oxide semiconductor films (the oxide semiconductor stack 403), oxygen can be supplied from the oxide insulating film 436 to the stack 493 of oxide semiconductor films (the oxide semiconductor stack 403). Heat treatment may be performed in the state where the stack 493 of oxide semiconductor films (the oxide semiconductor stack 403) and the oxide insulating film 436 are in contact with each other at least partly to supply oxygen to the stack 493 of oxide semiconductor films (the oxide semiconductor stack 403).

In order that hydrogen or water will be not contained in the stack 493 of oxide semiconductor films (the first oxide semiconductor film 191 and the second oxide semiconductor film 192) as much as possible in the formation step of the stack 493 of oxide semiconductor films (the first oxide semiconductor film 191 and the second oxide semiconductor film 192), it is preferable to heat the substrate provided with the oxide insulating film 436 in a preheating chamber in a sputtering apparatus as a pretreatment for formation of the stack 493 of oxide semiconductor films (the first oxide semiconductor film 191 and the second oxide semiconductor film 192) so that impurities such as hydrogen and moisture adsorbed to the substrate and/or the oxide insulating film 436 are eliminated and removed. As an evacuation unit provided in the preheating chamber, a cryopump is preferable.

Plarnarlization treatment may be performed on the region of the oxide insulating film 436 which is in contact with the stack 493 of oxide semiconductor films (the oxide semiconductor stack 403). As the planarization treatment, polishing treatment (e.g., chemical mechanical polishing (CMP)), dry-etching treatment, or plasma treatment can be used, though there is no particular limitation on the planarization treatment.

As the plasma treatment, a reverse sputtering in which an argon gas is introduced and plasma is produced can be performed. The reverse sputtering is a method in which voltage is applied to a substrate side with use of an RF power supply in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the oxide insulating film 436.

As the planarization treatment, polishing treatment, dry-etching treatment, or plasma treatment may be performed plural times and/or in combination. In the case where the treatments are combined, the order of steps is not particularly limited and may be set as appropriate in accordance with roughness of the surface of the oxide insulating film 436.

Note that it is preferable that the first oxide semiconductor film 191 and the second oxide semiconductor film 192 be formed under a condition that much oxygen is included during film formation (e.g., formed by a sputtering method in a 100% oxygen atmosphere), so that a film containing much oxygen (preferably a film including a region containing oxygen in excess of the stoichiometric ratio in the oxide semiconductor in a crystalline state) is formed.

Note that in this embodiment, an In—Sn—Zn—O film is formed as the first oxide semiconductor film 191 by a sputtering method with the use of an oxide target having an atomic ratio of In:Sn:Zn=1:2:2, 2:1:3, 1:1:1, or 20:45:35, for example.

Note that in this embodiment, a target used for the formation of the second oxide semiconductor film 192 by a sputtering method is, for example, an oxide target containing $In_2O_3$, $Ga_2O_3$, and ZnO at a composition ratio of 1:1:2 [molar ratio], so that an In—Ga—Zn-based oxide film is formed. Without limitation to the material and the component of the target, it is also possible to use, for example, a metal oxide target containing $In_2O_3$, $Ga_2O_3$, and ZnO at a composition ratio of 1:1:1 [molar ratio].

The filling rate of the metal oxide target is greater than or equal to 90% and less than or equal to 100%, preferably greater than or equal to 95% and less than or equal to 99.9%. With the use of the metal oxide target with high filling rate, a dense oxide semiconductor film can be formed.

It is preferable that a high-purity gas from which an impurity such as hydrogen, water, a hydroxyl group, or hydride is removed be used as a sputtering gas for the formation of the first oxide semiconductor film 191 and the second oxide semiconductor film 192.

The substrate is held in a deposition chamber kept under reduced pressure. Then, residual moisture in the deposition chamber is removed, a sputtering gas from which hydrogen and moisture are removed is introduced, and the above-described target is used, so that the stack 493 of oxide semiconductor films (the first oxide semiconductor film 191 and the second oxide semiconductor film 192) is formed over the substrate 400. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity in the stack 493 of oxide semiconductor films (the first oxide semiconductor film 191 and the second oxide semiconductor film 192) formed in the deposition chamber can be reduced.

It is preferable that the oxide insulating film 436 and the stack 493 of oxide semiconductor films (the first oxide semiconductor film 191 and the second oxide semiconductor film 192) be successively formed without exposure to the air. When the oxide insulating film 436 and the stack 493 of oxide semiconductor films (the first oxide semiconductor film 191 and the second oxide semiconductor film 192) are formed in succession without exposure to the air, impurities such as hydrogen and moisture can be prevented from being adsorbed onto a surface of the oxide insulating film 436.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Figure 2B:
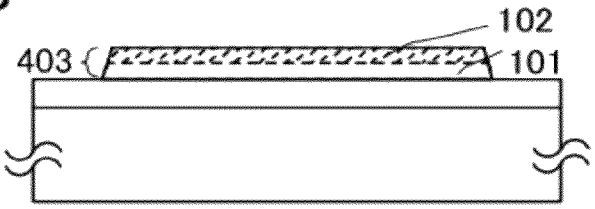

The stack 493 of oxide semiconductor films (the first oxide semiconductor film 191 and the second oxide semiconductor film 192) is processed into an island-shaped oxide semiconductor stack 403 (the first oxide semiconductor layer 101 and the second oxide semiconductor layer 102) by a photolithography process (see FIG. 2B).

Further, a resist mask for forming the island-shaped oxide semiconductor stack 403 may be formed by an ink jet method. Formation of the resist mask by an ink jet method needs no photomask; thus, manufacturing cost can be reduced.

Note that the etching of the oxide semiconductor film may be either dry etching or wet etching, or both. As an etchant used for wet etching of the oxide semiconductor film, for example, a mixed solution of phosphoric acid, acetic acid, and nitric acid, or the like can be used. As the etchant, ITO07N (produced by KANTO CHEMICAL CO., INC.) may also be used.

In this embodiment, since the first oxide semiconductor film 191 and the second oxide semiconductor film 192 are etched with the same mask, the first oxide semiconductor layer 101 and the second oxide semiconductor layer 102 have the same shape where end portions of side surfaces are aligned. In the oxide semiconductor stack 403, side surfaces (end portions) of the first oxide semiconductor layer 101 and the second oxide semiconductor layer 102 are exposed.

Further, heat treatment may be performed on the oxide semiconductor stack 403 (the stack 493 of oxide semiconductor films) in order to remove excess hydrogen (including water and a hydroxyl group) (to perform dehydration or dehydrogenation). The temperature of the heat treatment is higher than or equal to 300° C. and lower than or equal to 700° C., or lower than the strain point of a substrate. The heat treatment can be performed under reduced pressure, a nitrogen atmosphere, or the like. For example, the substrate is introduced into an electric furnace which is one of heat treatment apparatuses, and the heat treatment is performed on the oxide semiconductor stack 403 (the stack 493 of oxide semiconductor films) at 450° C. for an hour in a nitrogen atmosphere.

Note that the heat treatment apparatus used is not limited to an electric furnace, and a device for heating an object to be processed by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in the heat treatment, it is preferable that water, hydrogen, and the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, further preferably 7N (99.99999%) or more (i.e., the impurity concentration is 1 ppm or less, preferably 0.1 ppm or less).

In addition, after the oxide semiconductor stack 403 (the stack 493 of oxide semiconductor films) is heated by the heat treatment, it is possible to introduce, into the same furnace, a high-purity oxygen gas, a high-purity $N_2O$ gas, or ultra-dry air (with a moisture content of 20 ppm (equivalent to a dew point of −55° C.) or less, preferably 1 ppm or less, further preferably 10 ppb or less, when measured with a dew point meter using cavity ring down laser spectroscopy (CRDS)). It is preferable that water, hydrogen, and the like be not contained in the oxygen gas or the $N_2O$ gas. The purity of the oxygen gas or the $N_2O$ gas that is introduced into the heat treatment apparatus is preferably greater than or equal to 6N, more preferably greater than or equal to 7N (i.e., the concentration of impurities in the oxygen gas or the $N_2O$ gas is preferably less than or equal to 1 ppm, more preferably less than or equal to 0.1 ppm). The oxygen gas or the $N_2O$ gas acts to supply oxygen that is a main component material of the oxide semiconductor and that is reduced by the step for removing an impurity for the dehydration or dehydrogenation, so that the oxide semiconductor stack 403 (the stack 493 of oxide semiconductor films) can be a highly purified, electrically i-type (intrinsic) oxide semiconductor stack.

Such heat treatment for dehydration or dehydrogenation may be performed at any timing in the process of manufacturing the transistor 440a as long as it is performed between the formation of the stack 493 of oxide semiconductor films (the first oxide semiconductor film 191 and the second oxide semiconductor film 192) and the formation of the insulating film 407. For example, the heat treatment can be performed after the formation of the stack 493 of oxide semiconductor films (the first oxide semiconductor film 191 and the second oxide semiconductor film 192), or after the formation of the island-shaped oxide semiconductor stack 403 (the first oxide semiconductor layer 101 and the second oxide semiconductor layer 102).

The heat treatment for dehydration or dehydrogenation may be performed plural times and may be combined with another heat treatment. For example, heat treatment may be performed twice: after the formation of the first oxide semiconductor film 191 and after the formation of the second oxide semiconductor film 192.

It is preferable that the heat treatment for dehydration or dehydrogenation be performed in a state where the stack 493 of oxide semiconductor films (the first oxide semiconductor film 191 and the second oxide semiconductor film 192) covers the oxide insulating film 436 before the stack 493 of oxide semiconductor films is processed into the island-shaped oxide semiconductor stack 403 (the first oxide semiconductor layer 101 and the second oxide semiconductor layer 102). This is because oxygen included in the oxide insulating film 436 can be prevented from being released by the heat treatment.

Next, a conductive film for forming a source electrode layer and a drain electrode layer (including a wiring formed of the same layer as the source electrode layer and the drain electrode layer) is formed over the oxide semiconductor stack 403. The conductive film is formed of a material that can withstand heat treatment performed later. As the conductive film used for the source electrode layer and the drain electrode layer, for example, a metal film containing an element selected from Al, Cr, Cu, Ta, Ti, Mo, and W and a metal nitride film containing any of the above elements as its component (a titanium nitride film, a molybdenum nitride film, or a tungsten nitride film) can be used. A metal film having a high melting point made of Ti, Mo, W, or the like or a metal nitride film made of any of these elements (a titanium nitride film, a molybdenum nitride film, or a tungsten nitride film) may be stacked on one of or both of a lower side and an upper side of a metal film made of Al, Cu, or the like. Alternatively, the conductive film used for the source electrode layer and the drain electrode layer may be formed of a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

A resist mask is formed over the conductive film by a photolithography process, and is selectively etched, so that the source electrode layer 405a and the drain electrode layer 405b are formed. Then, the resist mask is removed. In this embodiment, a 10-nm-thick tungsten film is formed as each of the source electrode layer 405a and the drain electrode layer 405b. Owing to the small thickness of each of the source electrode layer 405a and the drain electrode layer 405b as described above, the coverage with the gate insulating film 402 formed thereover is improved. In addition, in the case where a dopant is introduced into the oxide semiconductor stack 403 to form a low resistance region, a dopant can be introduced into the oxide semiconductor stack 403 under the source electrode layer 405a and the drain electrode layer 405b through the source electrode layer 405a and the drain electrode layer 405b.

Since the side surfaces (end portions) of the first oxide semiconductor layer 101 and the second oxide semiconductor layer 102 in the oxide semiconductor stack 403 are exposed, each of the source electrode layer 405a and the drain electrode layer 405b is formed in contact with part of the side surfaces of the first oxide semiconductor layer 101 and the second oxide semiconductor layer 102.

Figure 2C:
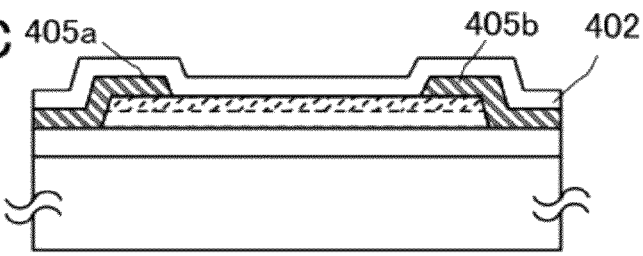

Next, the gate insulating film 402 is formed to cover the oxide semiconductor stack 403, the source electrode layer 405a, and the drain electrode layer 405b (see FIG. 2C).

Note that in order to improve the coverage with the gate insulating film 402, the above-mentioned planarization treatment may be performed also on surfaces of the oxide semiconductor stack 403, the source electrode layer 405a, and the drain electrode layer 405b. Particularly in the case where a thin insulating film is used as the gate insulating film 402, the surfaces of the oxide semiconductor stack 403, the source electrode layer 405a, and the drain electrode layer 405b preferably have high plarnality.

The gate insulating film 402 can have a thickness of 1 nm to 20 nm and can be formed by a sputtering method, an MBE method, a CVD method, a pulse laser deposition method, an ALD method, or the like as appropriate. The gate insulating film 402 may be formed with a sputtering apparatus which performs film deposition on surfaces of a plurality of substrates set substantially perpendicular to a surface of a sputtering target.

As the gate insulating film 402, a silicon oxide film, a gallium oxide film, an aluminum oxide film, a silicon nitride film, a silicon oxynitride film, an aluminum oxynitride film, or a silicon nitride oxide film can be used. It is preferable that the gate insulating film 402 contain oxygen in a portion in contact with the oxide semiconductor stack 403. In particular, the gate insulating film 402 preferably contains oxygen which exceeds at least the stoichiometric ratio in the film (the bulk). For example, in the case where a silicon oxide film is used as the gate insulating film 402, the composition formula is $SiO_{2+\alpha}$ ($\alpha>0$). In this embodiment, a silicon oxide film of $SiO_{2+\alpha}$ ($\alpha>0$) is used as the gate insulating film 402. By using the silicon oxide film as the gate insulating film 402, oxygen can be supplied to the oxide semiconductor stack 403 and favorable characteristics can be obtained. Further, the gate insulating film 402 is preferably formed in consideration of the size of a transistor to be formed and the step coverage with the gate insulating film 402.

The gate insulating film 402 can be formed with the use of a high-k material such as hafnium oxide, yttrium oxide, hafnium silicate ($HfSi_xO_y$(x>0, y>0)), hafnium silicate to which nitrogen is added ($HfSiO_xN_y$(x>0, y>0)), hafnium aluminate ($HfAl_xO_y$(x>0, y>0)), or lanthanum oxide, whereby gate leakage current can be reduced. Further, the gate insulating film 402 may have a single-layer structure or a stacked structure.

Then, the gate electrode layer 401 is formed over the gate insulating film 402 by a plasma CVD method, a sputtering method, or the like. The gate electrode layer 401 can be formed with the use of a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked structure.

The gate electrode layer 401 can be formed with the use of a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function of 5 eV or higher, preferably 5.5 eV or higher, which enables the threshold voltage, which is one of electric characteristics of the transistor, to be a positive value when used for the gate electrode layer; accordingly, a so-called normally-off switching element can be provided.

Figure 2D:
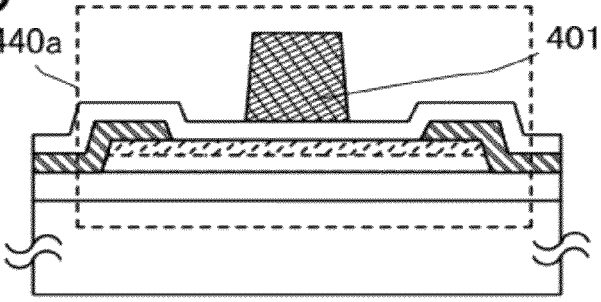

Through the above steps, the transistor 440a of this embodiment is manufactured (see FIG. 2D). With the use of the oxide semiconductor stack 403 composed of a plurality of oxide semiconductor layers having different energy gaps (the first oxide semiconductor layer 101 and the second oxide semiconductor layer 102), the electric characteristics of the transistors 440a and 440b can be accurately controlled; accordingly, desired electric characteristics can be given to the transistors 440a and 440b.

Figure 2E:
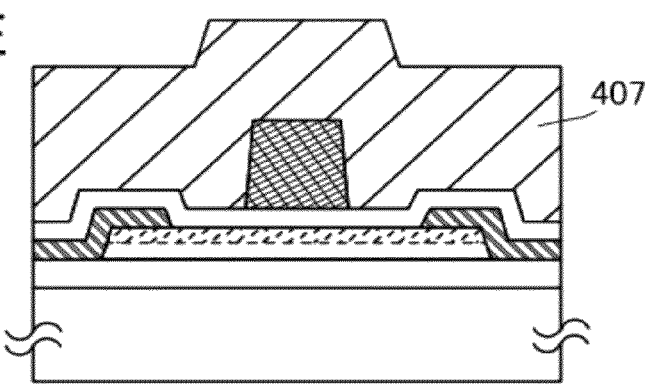

Next, the insulating film 407 is formed over the oxide semiconductor stack 403, the source electrode layer 405a, the drain electrode layer 405b, the gate insulating film 402, and the gate electrode layer 401 (see FIG. 2E).

The insulating film 407 can be formed by a plasma CVD method, a sputtering method, an evaporation method, or the like. As the insulating film 407, an inorganic insulating film such as a silicon oxide film, a silicon oxynitride film, an aluminum oxynitride film, or a gallium oxide film can be typically used.

Furthermore, as the insulating film 407, an aluminum oxide film, a hafnium oxide film, a magnesium oxide film, a zirconium oxide film, a lanthanum oxide film, a barium oxide film, or a metal nitride film (e.g., an aluminum nitride film) can be used.

The insulating film 407 may be a single layer or a stack, and for example a stack of a silicon oxide film and an aluminum oxide film can be used.

The insulating film 407 is preferably formed by a method by which impurities such as water and hydrogen do not enter the insulating film 407, such as a sputtering method, as appropriate. In the insulating film 407, an insulating film in contact with the oxide semiconductor stack 403 preferably contains excessive oxygen because the insulating film serves as an oxygen supply source for the oxide semiconductor stack 403.

In this embodiment, a 100-nm-thick silicon oxide film is formed as the insulating film 407 by a sputtering method. The formation of the silicon oxide film by a sputtering method can be performed in a rare gas (typically argon) atmosphere, an oxygen atmosphere, or a mixed atmosphere of a rare gas and oxygen.

As in the case of forming the oxide semiconductor film, an entrapment vacuum pump (e.g., a cryopump) is preferably used in order to remove moisture remaining in a deposition chamber used for forming the insulating film 407. When the insulating film 407 is formed in the deposition chamber evacuated using a cryopump, the concentration of impurities in the insulating film 407 can be reduced. A turbo molecular pump provided with a cold trap may be used as an evacuation unit for removing moisture remaining in the deposition chamber used for forming the insulating film 407.

It is preferable that a high-purity gas in which an impurity such as hydrogen, water, a hydroxyl group, or hydride is reduced be used as the sputtering gas for the formation of the insulating film 407.

Figure 3A:
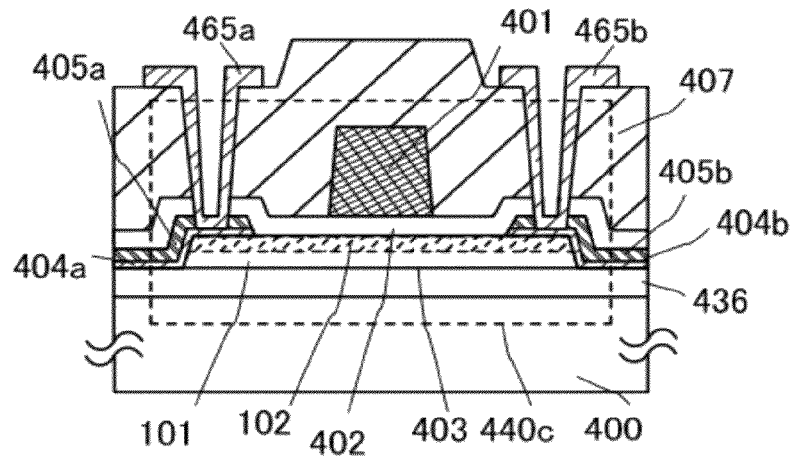
FIGS. 3A to 3C each illustrate one mode of a semiconductor device.
Figure 3B:
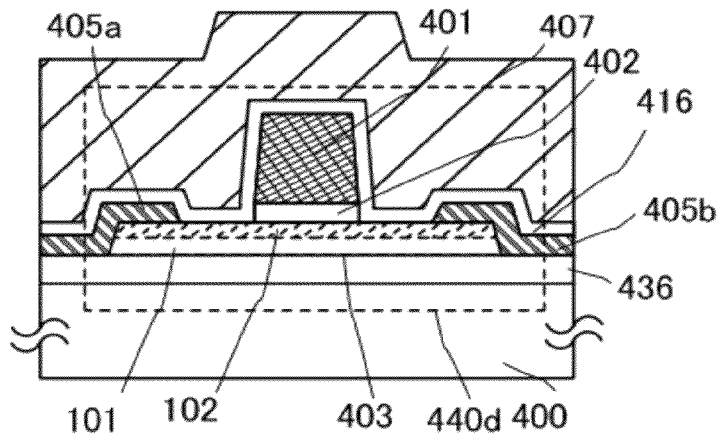

As illustrated in FIG. 3B, an insulating film 416 may be formed as an interlayer insulating film between the transistor 440d and the insulating film 407, so that an insulating film provided over the transistor 440d has a stacked structure. For the formation of the insulating film 416, the material and the method for forming the insulating film 407 can be employed. For example, an aluminum oxide film is used as the insulating film 416 and a silicon oxide film is used as the insulating film 407, whereby a stack of the aluminum oxide film and the silicon oxide film can be used as the insulating film provided over the transistor 440d. Note that the transistor 440d is an example of a transistor in which the gate insulating film 402 is etched using the gate electrode layer 401 as a mask to expose part of the oxide semiconductor stack 403, and the insulating film 416 is formed to be in contact with part of the oxide semiconductor stack 403.

An aluminum oxide film which can be used as the insulating film 407 and the insulating film 416 and is provided over the oxide semiconductor stack 403 has a high shielding effect (blocking effect) of preventing penetration of both oxygen and an impurity such as hydrogen or moisture.

Therefore, in and after the manufacturing process, the aluminum oxide film functions as a protective film for preventing entry of an impurity such as hydrogen or moisture, which causes a change in characteristics, into the oxide semiconductor stack 403 and release of oxygen, which is a main component material of the oxide semiconductor, from the oxide semiconductor stack 403.

Further, a planarization insulating film may be formed thereover in order to reduce surface roughness due to the transistor. As the planarization insulating film, an organic material such as a polyimide-based resin, an acrylic-based resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Further, openings reaching the source electrode layer 405a or the drain electrode layer 405b may be formed in the insulating film 407, and a wiring layer electrically connected to the source electrode layer 405a or the drain electrode layer 405b may be formed in the opening. Various structures of circuits can be configured by connecting the transistor 440d to another transistor through the wiring layer.

The source electrode layer 405a and the drain electrode layer 405b are partly over-etched in the etching process for forming the openings reaching the source electrode layer 405a or the drain electrode layer 405b in some cases. The source electrode layer and the drain electrode layer can have a stacked structure which includes a conductive film serving as an etching stopper in the formation of the openings.

As illustrated in FIG. 3A, the transistor 440c is an example of a transistor in which the source electrode layer and the drain electrode layer have a stacked structure. A source electrode layer 404a and a source electrode layer 405a are stacked to form the source electrode layer, and a drain electrode layer 404b and a drain electrode layer 405b are stacked to form the drain electrode layer. As in the transistor 440c, openings reaching the source electrode layer 404a or the drain electrode layer 404b may be formed in the gate insulating film 402, the insulating film 407, and the source and drain electrode layers 405a and 405b, and a wiring layer 465a and a wiring layer 465b electrically connected to the source electrode layer 404a and the drain electrode layer 404b may be formed in the openings.

In the transistor 440c, the source and drain electrode layers 404a and 404b also serves as an etching stopper in the formation of the openings. For the source and drain electrode layers 404a and 404b, a tungsten film, a tantalum nitride film, or the like can be used. For the source and drain electrode layers 405a and 405b, a copper film, an aluminum film, or the like can be used. When the thickness of the stack of the source electrode layer 404a and the source electrode layer 405a and the thickness of the stack of the drain electrode layer 404b and the drain electrode layer 405b are each greater than or equal to 5 nm and less than or equal to 15 nm, the coverage with the gate insulating film 402 can be high.

For the formation of the wiring layers 465a and 465b, the material and the method for forming the gate electrode layer 401, the source electrode layer 405a, and the drain electrode layer 405b can be employed. For example, as the wiring layers 465a and 465b, a stack of a tantalum nitride film and a copper film or a stack of a tantalum nitride film and a tungsten film can be used.

Furthermore, a sidewall insulating layer may be provided on the side surface of the gate electrode layer 401. The sidewall insulating layer may be formed on the side surface of the gate electrode layer 401 in a self-aligning manner by forming an insulating layer to cover the gate electrode layer 401, and then processing the insulating layer by anisotropic etching by an RIE (reactive ion etching) method. There is no particular limitation on the insulating film; for example, a silicon oxide film with favorable step coverage, which is formed by reacting TEOS (tetraethyl ortho-silicate), silane, or the like with oxygen, nitrous oxide, or the like can be used. The insulating film can be formed by a thermal CVD method, a plasma-enhanced CVD method, a normal-pressure CVD method, a bias ECRCVD method, a sputtering method, or the like. A silicon oxide film formed by a low temperature oxidation (LTO) method may also be used.

From the highly purified oxide semiconductor stack 403 whose oxygen vacancy has been filled, impurities such as hydrogen and water have been removed sufficiently, and the concentration of hydrogen in the oxide semiconductor stack 403 is $5\times10^{19}$ atoms/cm$^3$ or less, preferably $5\times10^{18}$ atoms/cm$^3$ or less. Note that the concentration of hydrogen in the oxide semiconductor stack 403 is measured by secondary ion mass spectrometry (SIMS).

In the transistor 440a formed according to this embodiment using the highly purified oxide semiconductor stack 403 containing excess oxygen with which the oxygen vacancy is filled, the value of a current in the off state (the value of an off-state current) per unit channel width (1 μm) can be reduced so as to be less than or equal to 100 zA/μm (1 zA (zeptoampere) is $1\times10^{-21}$ A), preferably less than or equal to 10 zA/μm, more preferably less than or equal to 1 zA/μm, further preferably less than or equal to 100 yA/μm at room temperature.

In the above manner, a semiconductor device which meets various purposes such as high performance, high reliability, and low power consumption can be provided.

Embodiment 2

In this embodiment, another embodiment of a semiconductor device and a method for manufacturing the semiconductor device are described with reference to FIGS. 5A to 5C. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

This embodiment shows an example of a method for manufacturing a transistor according to one embodiment of the present invention, oxygen (which contains at least any of an oxygen radical, an oxygen atom, and an oxygen ion) is introduced into an oxide semiconductor stack which has been dehydrated or dehydrogenated to supply oxygen to the film.

The dehydration or dehydrogenation treatment may accompany elimination of oxygen which is a main component material for an oxide semiconductor to lead to a reduction in oxygen. Oxygen vacancy exists in a portion where oxygen is eliminated in the oxide semiconductor stack, and a donor level which leads to a change in the electric characteristics of a transistor is formed owing to the oxygen vacancy.

Accordingly, oxygen is preferably supplied to the oxide semiconductor stack which has been subjected to dehydration or dehydrogenation. By supply of oxygen to the oxide semiconductor stack, oxygen vacancy in the film can be filled. Thus, by using the oxide semiconductor stack for a transistor, variation in the threshold voltage Vth of the transistor due to the oxygen vacancy and a shift of the threshold voltage ΔVth can be reduced. In addition, the threshold voltage can be positively shifted to make a normally-off transistor.

Figure 5A:
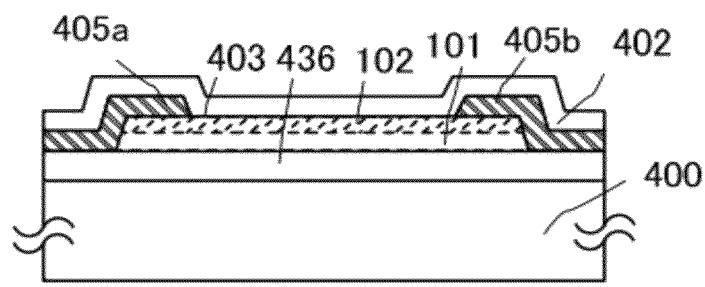
FIGS. 5A to 5C illustrate one mode of a semiconductor device and a method for manufacturing the semiconductor device.

FIG. 5A corresponds to FIG. 2C. Over the substrate 400 provided with the oxide insulating film 436, the oxide semiconductor stack 403 including the first oxide semiconductor layer 101 and the second oxide semiconductor layer 102 having different energy gaps, the source and drain electrode layers 405a and 405b, and the gate insulating film 402 are formed.

Figure 5B:
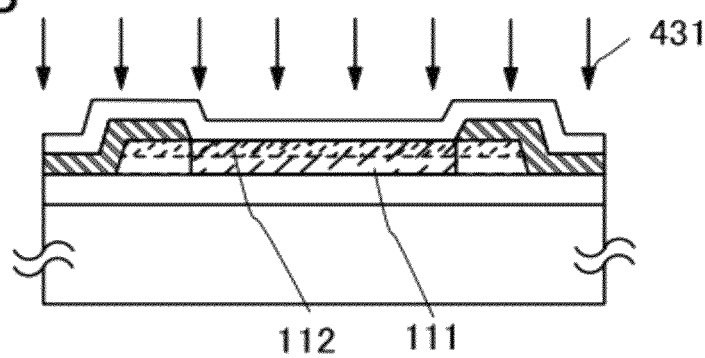

Next, by supply of oxygen 431 (which contains at least any of an oxygen radical, an oxygen atom, and an oxygen ion) to the oxide semiconductor stack 403, oxygen-excess regions 111 and 112 are formed in the oxide semiconductor stack 403 including the first oxide semiconductor layer 101 and the second oxide semiconductor layer 102 (see FIG. 5B).

Note that each of the oxygen-excess regions 111 and 112 at least partly includes a region containing oxygen in excess of the stoichiometric ratio in the oxide semiconductor in a crystalline state. The oxygen 431 supplied to the oxygen-excess regions 111 and 112 can fill oxygen vacancy in the oxide semiconductor stack 403 including the first oxide semiconductor layer 101 and the second oxide semiconductor layer 102.

Figure 5C:
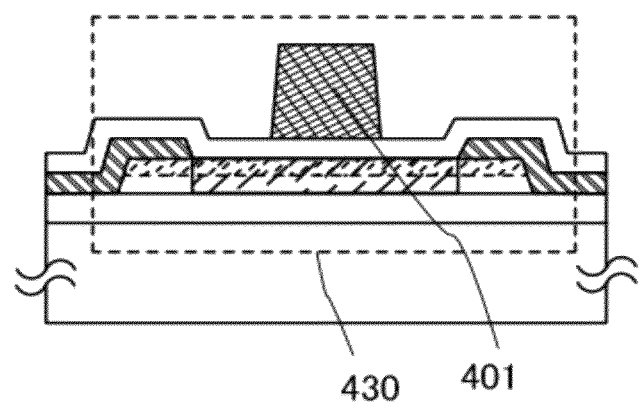

The gate electrode layer 401 is formed over the gate insulating film 402 and the oxide semiconductor stack 403 including the oxygen-excess regions 111 and 112, whereby a transistor 430 is manufactured (see FIG. 5C).

By introduction of oxygen into the oxide semiconductor stack 403 which has been subjected to dehydration or dehydrogenation treatment, the oxide semiconductor stack 403 can be highly purified and i-type (intrinsic). Variation in the electric characteristics of the transistor 430 including the highly purified and i-type (intrinsic) oxide semiconductor stack 403 is suppressed and the transistor is electrically stable.

As the method for introduction of oxygen, an ion implantation method, an ion doping method, a plasma immersion ion implantation method, plasma treatment, or the like can be used.

In the case where oxygen is introduced into the oxide semiconductor stack 403, oxygen may be directly introduced into the oxide semiconductor stack 403, or may be introduced into the oxide semiconductor stack 403 through other films such as the gate insulating film 402 and/or the insulating film 407. An ion implantation method, an ion doping method, a plasma immersion ion implantation method, or the like may be employed in the case where oxygen is introduced into the oxide semiconductor stack 403 through another film, whereas plasma treatment or the like can also be employed in the case where oxygen is directly introduced into the oxide semiconductor stack 403 which is exposed.

The introduction of oxygen into the oxide semiconductor stack 403 can be performed at any timing after dehydration or dehydrogenation is performed thereon. Further, oxygen may be introduced plural times into the oxide semiconductor stack 403 which has been subjected to the dehydration or dehydrogenation treatment.

For example, in Embodiment 1, oxygen can be introduced into the exposed stack 493 of oxide semiconductor films or the oxide semiconductor stack 403 after the formation of the source and drain electrode layers 405a and 405b, after the formation of the gate insulating film 402, after the formation of the gate electrode layer 401, (after the formation of the insulating film 416), and/or after the formation of the insulating film 407.

In the oxygen-excess regions 111 and 112 in the oxide semiconductor stack 403, the concentration of oxygen introduced by the oxygen introduction step is preferably greater than or equal to $1 \times 10^{18}$ atoms/cm$^3$ and less than or equal to $5 \times 10^{21}$ atoms/cm$^3$.

Note that in the oxide semiconductor, oxygen is one of main component materials. Thus, it is difficult to accurately estimate the oxygen concentration of the oxide semiconductor stack 403 by a method such as secondary ion mass spectrometry (SIMS). In other words, it can be said that it is hard to determine whether oxygen is intentionally added to the oxide semiconductor stack 403.

It is known that isotopes such as $^{17}$O and $^{18}$O exist in oxygen, and $^{17}$O and $^{18}$O account for about 0.037% and about 0.204% of all of the oxygen atoms in nature, respectively. That is to say, it is possible to estimate the concentrations of these isotopes by a method such as SIMS in the case where oxygen is intentionally added to the oxide semiconductor stack 403; therefore, the oxygen concentration of the oxide semiconductor stack 403 may be able to be estimated more accurately by measuring the concentrations of these isotopes. Thus, the concentrations of these isotopes may be measured to determine whether oxygen is intentionally added to the oxide semiconductor stack 403.

Heat treatment is preferably performed after oxygen is introduced into the oxide semiconductor film.

In the case where oxygen is directly introduced into the oxide semiconductor stack 403 as in the transistor 430 of this embodiment, the oxide insulating film 436 and the gate insulating film 402, which are in contact with the oxide semiconductor stack 403, are not necessarily films containing a large amount of oxygen. A film having a high shielding effect (blocking effect) with respect to oxygen, hydrogen, and impurities containing hydrogen such as water is preferably provided as the insulating film 407 so that oxygen introduced into the oxide semiconductor stack 403 is not eliminated therefrom and hydrogen and impurities containing hydrogen such as water do not enter the oxide semiconductor stack 403. For example, an aluminum oxide film or the like having a high shielding effect (blocking effect) with respect to both oxygen and impurities such as hydrogen or moisture may be used.

Needless to say, oxygen may be supplied by a plurality of methods. For example, oxygen may be introduced by using films containing much oxygen as the oxide insulating film 436 and the gate insulating film 402, which are in contact with the oxide semiconductor film, and by direct introduction of oxygen into the oxide semiconductor stack 403.

Although an example in which oxygen is introduced into the oxide semiconductor stack 403 is described in this embodiment, oxygen may be introduced into the gate insulating film 402, the oxide insulating film 436, and/or the insulating film 416 which are in contact with the oxide semiconductor stack 403, and/or the insulating film 407. The introduction of oxygen into the gate insulating film 402, the oxide insulating film 436, and/or the insulating film 416 which are in contact with the oxide semiconductor stack 403, and/or the insulating film 407, to make the film an oxygen-excess film, enables oxygen to be supplied to the oxide semiconductor stack 403.

Through the above steps, a semiconductor device including an oxide semiconductor stack with stable electric characteristics can be provided. Therefore, a semiconductor device with high reliability can be provided.

This embodiment can be implemented in appropriate combination with any of the other embodiments.

Embodiment 3

In this embodiment, another embodiment of a semiconductor device and a method for manufacturing the semiconductor device are described with reference to FIGS. 6A to 6C. The same portions as those in the above embodiments or the portions having functions similar to those in the above embodiments can be formed in manners similar to those of the above embodiments. The same steps as those in the above embodiments and steps similar to those in the above embodiments can be conducted in manners similar to those of the above embodiments. Therefore, the descriptions thereof are not repeated in this embodiment.

This embodiment describes, as an example, the case where a low resistance region is formed in the oxide semiconductor stack in the method for manufacturing the semiconductor device according to one embodiment of the disclosed invention. The low resistance region can be formed by introduction of an impurity (also referred to as dopant) changing the conductivity into the oxide semiconductor stack.

Figure 6A:
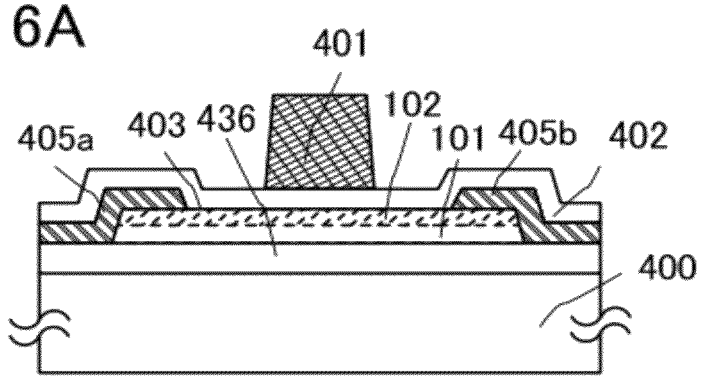
FIGS. 6A to 6C illustrate modes of semiconductor devices and a method for manufacturing the semiconductor devices.

FIG. 6A corresponds to FIG. 2D. Over the substrate 400 provided with the oxide insulating film 436, the oxide semiconductor stack 403 including the first oxide semiconductor layer 101 and the second oxide semiconductor layer 102 having different energy gaps, the source and drain electrode layers 405a and 405b, the gate insulating film 402, and the gate electrode layer 401 are formed.

Next, with the use of the gate electrode layer 401 as a mask, a dopant 421 is selectively introduced into the oxide semiconductor stack 403 through the gate insulating film 402, the source electrode layer 405a, and the drain electrode layer 405b, thereby forming low resistance regions 121a, 121b, 122a, and 122b.

This embodiment describes, as an example, the case where the source electrode layer 405a and the drain electrode layer 405b are thin films and thus the dopant 421 is also introduced into the oxide semiconductor stack 403 under the source electrode layer 405a and the drain electrode layer 405b, thereby forming the low resistance regions 121a, 121b, 122a, and 122b.

The dopant 421 is not introduced into the oxide semiconductor stack 403 in the regions under the source electrode layer 405a and the drain electrode layer 405b in some cases, or the dopant 421 is introduced into the oxide semiconductor stack 403 in the regions under the source electrode layer 405a and the drain electrode layer 405b such that the dopant concentration thereof is higher than that of the other low resistance region in some cases, depending on the thickness of each of the source electrode layer 405a and the drain electrode layer 405b and the condition of introduction of the dopant 421. Furthermore, in the case where the dopant 421 is introduced into only the first oxide semiconductor layer 101 or only the second oxide semiconductor layer 102 depending on the conditions of the introduction to form the low resistance regions, there is a difference in concentration distribution of the dopant between the first oxide semiconductor layer 101 and the second oxide semiconductor layer 102 in some cases.

The dopant 421 is an impurity by which the conductivity of the oxide semiconductor stack 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 421 is introduced into the oxide semiconductor stack 403 through the insulating film 407, the source electrode layer 405a, and the drain electrode layer 405b by an implantation method. As a method for introducing the dopant 421, an ion implantation method, an ion doping method, a plasma immersion ion implantation method, or the like can be used. In that case, it is preferable to use a single ion of the dopant 421, or a fluoride ion or chloride ion thereof.

The introduction of the dopant 421 may be controlled by setting the introduction conditions such as the accelerated voltage and the dosage, or the thickness of the insulating film 407 through which ions pass, as appropriate. In this embodiment, boron is used as the dopant 421, and boron ions are implanted by an ion implantation method. Note that the dosage of the dopant 421 may be greater than or equal to $1 \times 10^{13}$ ions/cm$^2$ and less than or equal to $5 \times 10^{16}$ ions/cm$^2$.

The concentration of the dopant 421 in the low resistance region is preferably greater than or equal to $5 \times 10^{18}$ atoms/cm$^3$ and less than or equal to $1 \times 10^{22}$ atoms/cm$^3$.

The dopant 421 may be introduced while the substrate 400 is being heated.

Note that the introduction of the dopant 421 into the oxide semiconductor stack 403 may be performed plural times, and plural kinds of dopants may be used.

Further, heat treatment may be performed after the dopant 421 is introduced. As the preferable heating conditions, the heat temperature is higher than or equal to 300° C. and lower than or equal to 700° C., preferably higher than or equal to 300° C. and lower than or equal to 450° C., and the heat treatment is preferably performed in an oxygen atmosphere for an hour. Further, the heat treatment may be performed in a nitrogen atmosphere, or under reduced pressure or the air (ultra dry air).

In the case where at least one of layers in the oxide semiconductor stack 403 is a crystalline oxide semiconductor film, part of the crystalline oxide semiconductor film becomes amorphous in some cases by introduction of the dopant 421. In that case, the crystallinity of the oxide semiconductor stack 403 can be recovered by performing heat treatment thereon after the introduction of the dopant 421.

In the oxide semiconductor stack 403, accordingly, the first oxide semiconductor layer 101 where a channel formation region 121c is sandwiched between the low resistance regions 121a and 121b, and the second oxide semiconductor layer 102 where a channel formation region 122c is sandwiched between the low resistance regions 122a and 122b are formed.

Figure 6B:
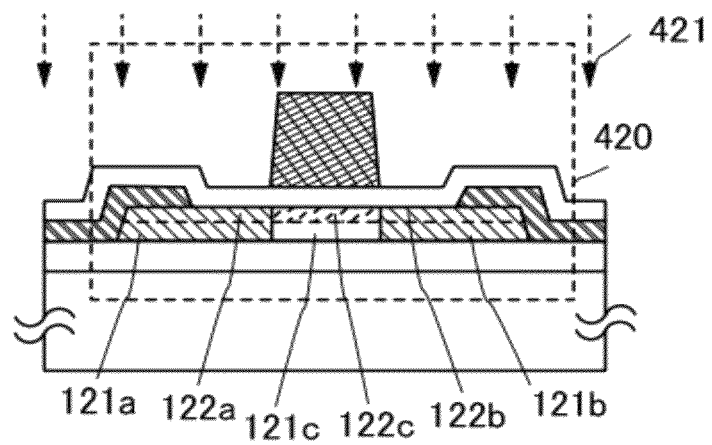

Through the above steps, a transistor 420 of this embodiment is manufactured (see FIG. 6B).

Figure 3C:
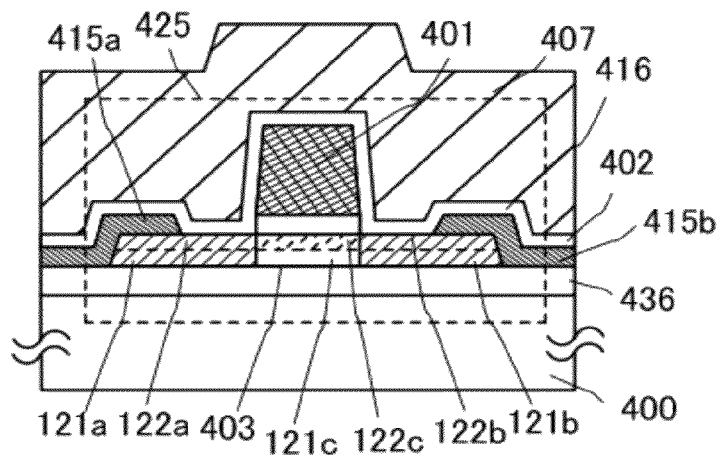

FIG. 3C illustrates a transistor 425 having a low resistance region, which is formed by introducing a dopant into a transistor in which the gate insulating film 402 is etched with the use of the gate electrode layer 401 as a mask so that the oxide semiconductor stack 403 is partly exposed to be in contact with the insulating film 416 as in the transistor 440d of Embodiment 1.

The transistor 425 is manufactured in such a manner that a dopant is introduced with the use of the gate electrode layer 401 as a mask to form the low resistance regions 121a and 121b between which the channel formation region 121c is sandwiched and the low resistance regions 122a and 122b between which the channel formation region 122c is sandwiched. When the dopant is introduced into the transistor through the source electrode layer and the drain electrode layer, the dopant is also introduced into the source electrode layer and the drain electrode layer in some cases. The transistor 425 is an example of a transistor in which the dopant is also introduced into the source electrode layer and the drain electrode layer, thereby forming a source electrode layer 415a containing a dopant and a drain electrode layer 415b containing a dopant.

Since the oxide semiconductor stack 403 in each of the transistors 420 and 425 includes the first oxide semiconductor layer 101 where the low resistance regions 121a and 121b are formed in the channel length direction with the channel formation region 121c provided therebetween and the second oxide semiconductor layer 102 where the low resistance regions 122a and 122b are formed in the channel length direction with the channel formation region 122c provided therebetween, whereby the transistor 420 and the transistor 425 have excellent on-state characteristics (e.g., on-state current and field effect mobility), resulting in high-speed operation and quick response.

Figure 6C:
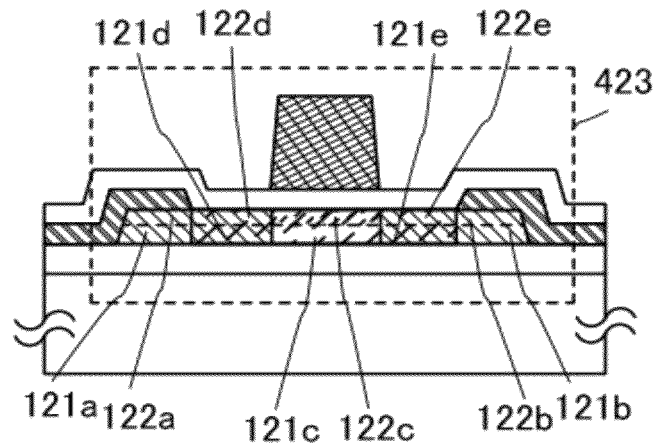

FIG. 6C illustrates a transistor 423 including a low resistance region, which is formed by introducing a dopant into the transistor 430 including the oxygen-excess region of Embodiment 2.

In the transistor 423 is manufactured in such a manner that with the use of the gate electrode layer 401 as a mask, a dopant is introduced into a transistor, which is provided with an oxide semiconductor stack which includes the first oxide semiconductor layer 101 including the oxygen-excess region 111 and the second oxide semiconductor layer 102 including the oxygen-excess region 112 like the transistor 430 in FIG. 5C, to form low resistance regions 121d, 121e, 122d, and 122e each containing a dopant and excessive oxygen, and the low resistance regions 121a, 121b, 122a, and 122b each containing a dopant. The channel formation regions 121c and 122c containing excessive oxygen are sandwiched between the low resistance regions 121a, 122a, 121d, and 122d and the low resistance regions 121b, 122b, 121e, and 122e.

The oxide semiconductor stack 403 in the transistor 423 includes the first oxide semiconductor layer 101 where the low resistance regions 121d, 121e, 121a, and 121b are formed in the channel length direction with the channel formation region 121c provided therebetween and the second oxide semiconductor layer 102 where the low resistance regions 122d, 122e, 122a, and 122b are formed in the channel length direction with the channel formation region 122c provided therebetween, whereby the transistor 423 has excellent on-state characteristics (e.g., on-state current and field effect mobility), resulting in high-speed operation and quick response.

FIG. 4B illustrates a transistor 480b including an oxygen-excess region and a low resistance region, which is formed by introduction of oxygen and a dopant into a transistor provided with the oxide semiconductor stack 403 composed of three layers like the transistor 480a of Embodiment 1.

The transistor 480b is manufactured in such a manner that oxygen is introduced into the oxide semiconductor stack 403 including the first oxide semiconductor layer 101, the second oxide semiconductor layer 102, and the third oxide semiconductor layer 103 to form an oxygen-excess region; the gate electrode layer 401 is formed; a dopant is introduced with the use of the gate electrode layer 401 as a mask to form low resistance regions 121d, 121e, 122d, 122e, 123d, and 123e each containing a dopant and excessive oxygen and low resistance regions 121a, 121b, 122a, 122b, 123a, and 123b each containing a dopant. The channel formation regions 121c, 122c, 123c are sandwiched between the low resistance regions 121d, 122d, 123d, 121a, 122a, and 123a and the low resistance regions 121e, 122e, 123e, 121b, 122b, and 123b.

The oxide semiconductor stack 403 in the transistor 480b includes the first oxide semiconductor layer 101 where the low resistance regions 121d, 121e, 121a, and 121b are formed in the channel length direction with the channel formation region 121c provided therebetween, the second oxide semiconductor layer 102 where the low resistance regions 122d, 122e, 122a, and 122b are formed in the channel length direction with the channel formation region 122c provided therebetween, and the third oxide semiconductor layer 103 where the low resistance region 123d, 123e, 123a, and 123b are formed in the channel length direction with the channel formation region 123c provided therebetween the, whereby the transistor 480b has excellent on-state characteristics (e.g., on-state current and field effect mobility), resulting in high-speed operation and quick response.

In the transistors 420, 423, 425, and 480b, the low resistance regions 121a, 121b, 122a, and 122b can serve as a source region or a drain region. The provision of the low resistance regions 121a, 121b, 122a, 122b can relieve an electric field applied to the channel formation regions 121c and 122c which are formed between the low resistance regions 121a and 122a and the low resistance regions 121b and 122b. Furthermore, electrical connection between the oxide semiconductor stack 403 and the source and drain electrode layers 405a and 405b through the low resistance regions 121a, 121b, 122a, and 122b can reduce the contact resistance between the oxide semiconductor stack 403 and the source and drain electrode layers 405a and 405b. Consequently, the electrical characteristics of the transistors 420, 423, 425, and 480b can be enhanced.

This embodiment can be implemented in appropriate combination with any of the other embodiments.

Embodiment 4

A semiconductor device (also referred to as a display device) having a display function can be manufactured using the transistor an example of which is described in any of Embodiments 1 to 3. Moreover, part or all of the driver circuitry which includes the transistor can be formed over a substrate where a pixel portion is formed, whereby a system-on-panel can be formed.

Figure 7A:
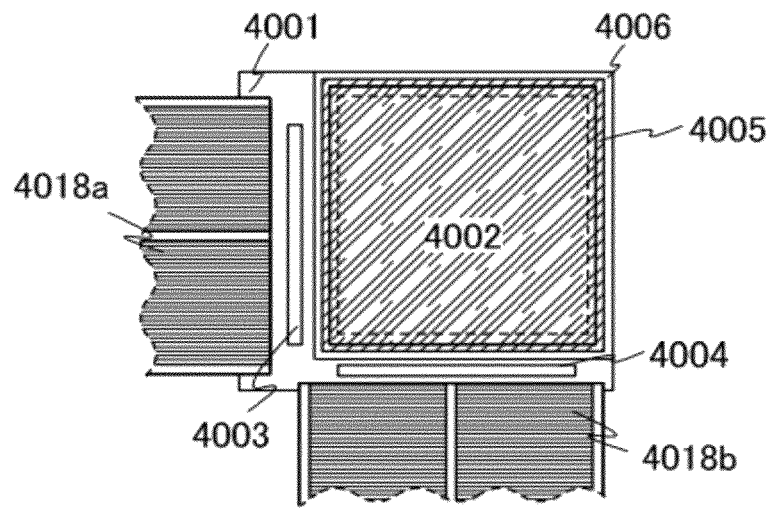
FIGS. 7A to 7C each illustrate one mode of a semiconductor device.

In FIG. 7A, a sealant 4005 is provided so as to surround a pixel portion 4002 provided over a first substrate 4001, and the pixel portion 4002 is sealed with a second substrate 4006. In FIG. 7A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003, the scan line driver circuit 4004, and the pixel portion 4002 from flexible printed circuits (FPCs) 4018a and 4018b.

Figure 7B:
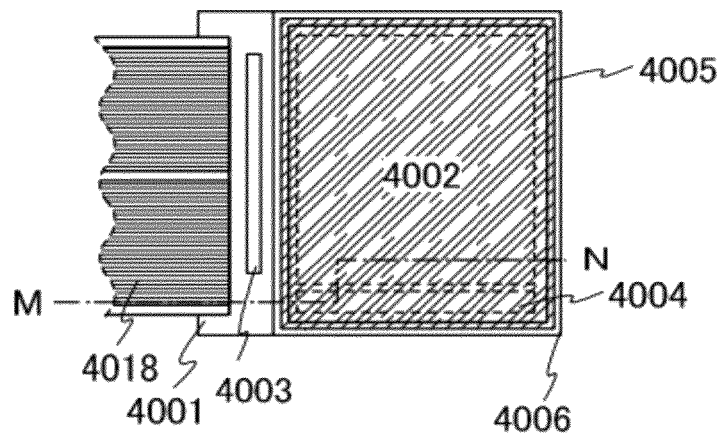
Figure 7C:
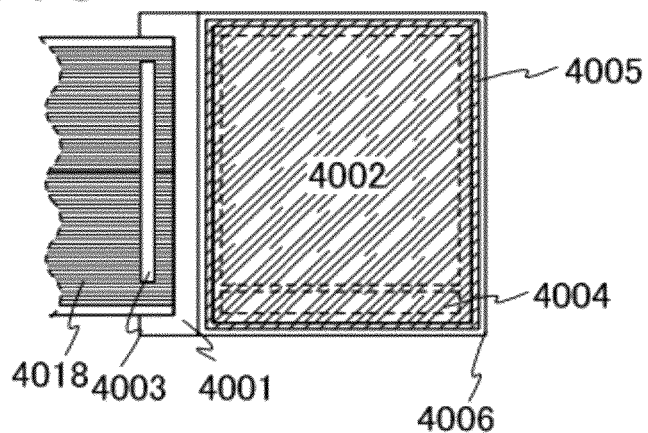

In FIGS. 7B and 7C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 7B and 7C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 7B and 7C, a variety of signals and potentials are supplied to the signal line driver circuit 4003, the scan line driver circuit 4004, and the pixel portion 4002 from an FPC 4018.

Although FIGS. 7B and 7C each illustrate an example in which the signal line driver circuit 4003 is formed separately and mounted over the first substrate 4001, embodiments of the present invention are not limited to this structure. The scan line driver circuit may be formed separately and then mounted, or only part of the signal line driver circuit or only part of the scan line driver circuit may be formed separately and then mounted.

The connection method of such a separately formed driver circuit is not particularly limited; for example, a chip on glass (COG) method, a wire bonding method, or a tape automated bonding (TAB) method can be used. FIG. 7A illustrates an example in which the signal line driver circuit 4003 and the scan line driver circuit 4004 are mounted by a COG method; FIG. 7B illustrates an example in which the signal line driver circuit 4003 is mounted by a COG method; and FIG. 7C illustrates an example in which the signal line driver circuit 4003 is mounted by a TAB method.

The display device includes in its category a panel in which a display element is sealed, and a module in which an IC such as a controller or the like is mounted on the panel.

The display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in Embodiments 1 to 3 can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically includes an inorganic electroluminescent (EL) element, an organic EL element, and the like. A display medium whose contrast is changed by an electric effect, such as electronic ink, can also be used.

One embodiment of a semiconductor device is described with reference to FIGS. 7A to 7C and FIGS. 8A and 8B. FIGS. 8A and 8B are cross-sectional diagrams taken along line M-N of FIG. 7B.

As shown in FIGS. 7A to 7C and FIGS. 8A and 8B, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

Each of the pixel portion 4002 and the scan line driver circuit 4004 which are provided over the first substrate 4001 includes a plurality of transistors. In FIGS. 7A to 7C and FIGS. 8A and 8B, the transistor 4010 included in the pixel portion 4002 and the transistor 4011 included in the scan line driver circuit 4004 are illustrated as an example. An insulating film 4020 is provided over the transistors 4010 and 4011 in FIG. 8A, and an insulating film 4021 is further provided in FIG. 8B. An insulating film 4023 is an insulating film serving as a base film.

Any of the transistors described in Embodiments 1 to 3 can be applied to the transistors 4010 and 4011. In this embodiment, an example in which a transistor having a structure similar to that of the transistor 440a described in Embodiment 1 is used is described.

Each of the transistors 4010 and 4011 includes an oxide semiconductor stack which is composed of at least two oxide semiconductor layers having different energy gaps as a semiconductor layer. With the use of the oxide semiconductor stack composed of a plurality of oxide semiconductor layers having different energy gaps, electric characteristics of the transistors can be accurately controlled; accordingly, desired electric characteristics can be given to the transistors 4010 and 4011.

Therefore, as the semiconductor devices of this embodiment illustrated in FIGS. 7A to 7C and FIGS. 8A and 8B, a semiconductor device which meets various purposes such as high performance, high reliability, and low power consumption can be provided.

The transistor 4010 included in the pixel portion 4002 is electrically connected to a display element to constitute a part of a display panel. There is no particular limitation on the kind of the display element as long as display can be performed, and various kinds of display elements can be used.

An example of a liquid crystal display device using a liquid crystal element as a display element is illustrated in FIG. 8A. In FIG. 8A, a liquid crystal element 4013 which is a display element includes a first electrode layer 4030, a second electrode layer 4031, and a liquid crystal layer 4008. Insulating films 4032 and 4033 serving as orientation films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A columnar spacer denoted by reference numeral 4035 is obtained by selective etching of an insulating film and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not used may be used for the liquid crystal layer 4008. The blue phase is one of liquid crystal phases, which is generated just before a cholesteric phase changes into an isotropic phase while temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, so that the alignment process is not requisite and the viewing angle dependence is small. In addition, since an alignment film does not need to be provided and thus rubbing treatment is not requisite, electrostatic discharge damage caused by the rubbing treatment can be prevented and defects and damage of the liquid crystal display device in the manufacturing process can be reduced. Thus, productivity of the liquid crystal display device can be improved. A transistor using an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device including the transistor using an oxide semiconductor film.

The specific resistivity of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. The specific resistivity in this specification is measured at 20° C.

The magnitude of a storage capacitor in the liquid crystal display device is set considering the leakage current of the transistor n the pixel portion or the like so that charge can be held for a predetermined period. The magnitude of the storage capacitor may be set considering the off-state current of the transistor or the like. By using the/a transistor including an oxide semiconductor film disclosed in this specification, a capacitance that is ⅓ or less, preferably ⅕ or less of liquid crystal capacitance of each pixel is enough as the magnitude of the storage capacitor.

In the transistor using an oxide semiconductor film disclosed in this specification, the current in an off state (off-state current) can be controlled to be low. Accordingly, an electric signal such as an image signal can be held for a longer period, and a writing interval can be set longer in an on state. The frequency of refresh operation can be accordingly reduced, which leads to an effect of suppressing power consumption.

Further, the transistor using an oxide semiconductor film disclosed in this specification can be controlled to exhibit a high field-effect mobility and thus can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided. Accordingly, reliability of the semiconductor device can also be improved.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode; for example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Embodiments of the disclosed invention are not limited to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether the light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. This light-emitting element is called a current-excitation light-emitting element after such a mechanism.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An organic EL element is used as the light-emitting element for description here.

To extract light emitted from the light-emitting element, it is necessary that at least one of the pair of electrodes has a light-transmitting property. A transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side; a light-emitting element having any of these emission structures can be used.

An example of a light-emitting device in which a light-emitting element is used as a display element is illustrated in FIG. 8B. A light-emitting element 4513 which is the display element is electrically connected to the transistor 4010 provided in the pixel portion 4002. A structure of the light-emitting element 4513 is not limited to the shown stacked structure, which is the stacked structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 is formed using an organic insulating material or an inorganic insulating material. It is preferable that the partition wall 4510 be formed using a photosensitive resin material and have an opening over the first electrode layer 4030 so that a sidewall of the opening is formed as a tilted surface with continuous curvature.

The electroluminescent layer 4511 has either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, a polyimide resin, an epoxy resin, a silicone resin, polyvinyl butyral (PVB), or ethylene vinyl acetate (EVA) can be used. For example, nitrogen is used for the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface so as to reduce the glare can be performed.

Further, electronic paper in which electronic ink is driven can be provided as the display device. The electronic paper is also called electrophoretic display device (electrophoretic display) and is advantageous in that it exhibits the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particles and the second particles each contain a pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Further, by using a color filter or particles that have a pigment, color display can also be achieved.

The first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 7A to 7C and FIGS. 8A and 8B, a flexible substrate as well as a glass substrate can be used as any of the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where the light-transmitting property is not requisite, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020.

The aluminum oxide film which is provided as the insulating film 4020 over the oxide semiconductor film has a high blocking effect by which both of oxygen and impurities such as hydrogen or moisture is prevented from being passed through the film.

Therefore, in and after the manufacturing process, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

The insulating film 4021 serving as a planarization insulating film can be formed using an organic material having heat resistance, such as acrylic, polyimide, benzocyclobutene-based resin, polyamide, or epoxy. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed of these materials.

There is no particular limitation on the method of forming the insulating film 4021, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken owing to static electricity or the like, a protection circuit for protecting the driver circuit is preferably provided. The protection circuit is preferably formed using a nonlinear element.

By applying any of the transistors described in Embodiments 1 to 3, semiconductor devices having a variety of functions can be provided.

Embodiment 5

Any of the transistors described in Embodiments 1 to 3 enables a semiconductor device having an image sensor function of reading data on an object to be manufactured.

Figure 9A:
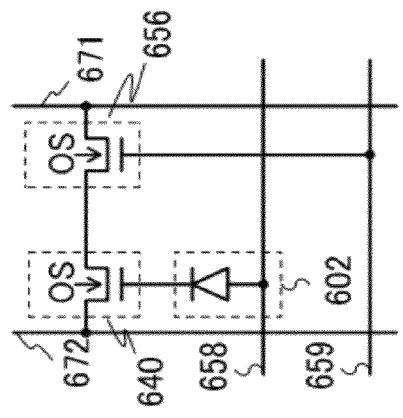
FIGS. 9A and 9B illustrate one mode of a semiconductor device.

FIG. 9A illustrates an example of a semiconductor device having an image sensor function. FIG. 9A is an equivalent circuit diagram of a photosensor, and FIG. 9B is a cross-sectional diagram of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

In the circuit diagrams in this specification, symbol "OS" is written under the mark of a transistor using an oxide semiconductor film so that it can be clearly identified as a transistor using an oxide semiconductor film. In FIG. 9A, the transistor 640 and the transistor 656 are transistors each using an oxide semiconductor layer, to which any of the transistors described in Embodiments 1 to 3 can be applied. Described in this embodiment is an example in which a transistor having a structure similar to that of the transistor 440a described in Embodiment 1 is used.

Figure 9B:
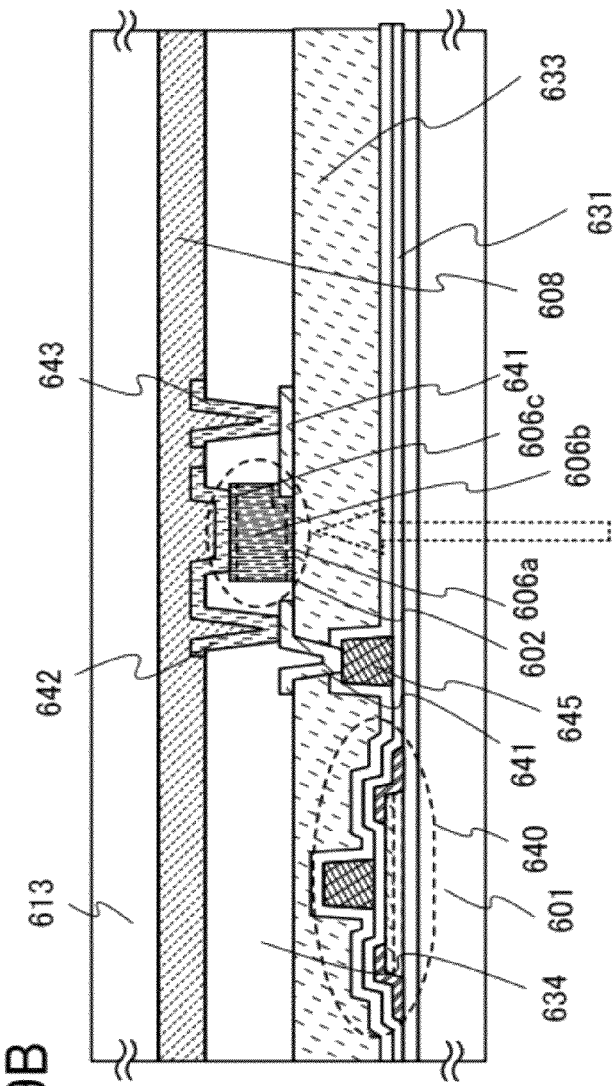

FIG. 9B is a cross-sectional diagram of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 641 formed over the interlayer insulating film 633 and an electrode layer 642 formed over the interlayer insulating film 634.

The electrode layer 641 is electrically connected to a conductive layer 643 formed over the interlayer insulating film 634, and the electrode layer 642 is electrically connected to a conductive layer 645 through the electrode layer 641. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma-enhanced CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be performed after the impurity element is added by an ion implantation method or the like to diffuse the impurity element. In that case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma-enhanced CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma-enhanced CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be performed after the impurity element is added by an ion implantation method or the like to diffuse the impurity element. In that case, as the method of forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that the stability is increased and thus a favorable microcrystalline semiconductor film can be obtained.

This microcrystalline semiconductor film can be formed by a radio-frequency plasma-enhanced CVD method with a frequency of greater than or equal to several tens of megahertz and less than or equal to several hundreds of megahertz, or a microwave plasma-enhanced CVD apparatus with a frequency of greater than or equal to 1 GHz. As a typical example, the microcrystalline semiconductor can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive film. A surface on the n-type semiconductor film side can alternatively be used as the light-receiving plane.

With the use of an insulating material, the insulating film 632, the interlayer insulating film 633, and the interlayer insulating film 634 can be formed, depending on the material, by a method or a tool (equipment) such as a sputtering method, a plasma-enhanced CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film is used as the insulating film 631. The insulating film 631 can be formed by a sputtering method or a plasma-enhanced CVD method.

The aluminum oxide film which is provided as the insulating film 631 over the oxide semiconductor film has a high blocking effect by which both of oxygen and impurities such as hydrogen or moisture is prevented from being passed through the film.

Therefore, in and after the manufacturing process, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

The insulating film 632 can be formed using an inorganic insulating material and can have a single-layer structure or a stacked structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

To reduce surface roughness, an insulating film functioning as a planarization insulating film is preferably used as each of the interlayer insulating films 633 and 634. For the interlayer insulating films 633 and 634, for example, an organic insulating material having heat resistance, such as polyimide, acrylic resin, a benzocyclobutene-based resin, polyamide, or an epoxy resin, can be used. Other than such organic insulating materials, it is possible to use a single layer or a stack of a low-dielectric constant material (low-k material), a siloxane-based resin, phosphosilicate glass (PSG), borophosphosilicate glass (BPSG), or the like.

With detection of light that enters the photodiode 602, data on an object to be detected can be read. A light source such as a backlight can be used at the time of reading data on the object.

With the use of the oxide semiconductor stack composed of a plurality of oxide semiconductor layers having different energy gaps as the oxide semiconductor layer, electric characteristics of the transistor can be accurately controlled; accordingly, desired electric characteristics can be given to the transistor. Therefore, with the use of such a transistor, a semiconductor device which meets various purposes such as high performance, high reliability, and low power consumption can be provided.

This embodiment can be implemented in appropriate combination with any of the structures described in the other embodiments.

Embodiment 6

The transistor an example of which is described in any of Embodiments 1 to 3 can be favorably used for a semiconductor device including an integrated circuit in which a plurality of transistors is stacked. In this embodiment, as an example of the semiconductor device, a memory medium (memory element) is described.

Manufactured in this embodiment is a semiconductor device which includes a transistor 140 which is a first transistor formed using a single crystal semiconductor substrate and a transistor 162 which is a second transistor formed using a semiconductor film and provided above the transistor 140 with an insulating film provided therebetween. The transistor an example of which is described in any of Embodiments 1 to 3 can be favorably used as the transistor 162. Described in this embodiment is an example in which a transistor having a structure similar to that of the transistor 440*a* described in Embodiment 1 is used as the transistor 162.

Semiconductor materials and structures of the transistor 140 and the transistor 162, which are stacked, may be the same as or different from each other. In this embodiment, an example is described in which materials and structures which are appropriate for the circuit of the memory medium (memory element) are employed for the transistors.

Figure 10A:
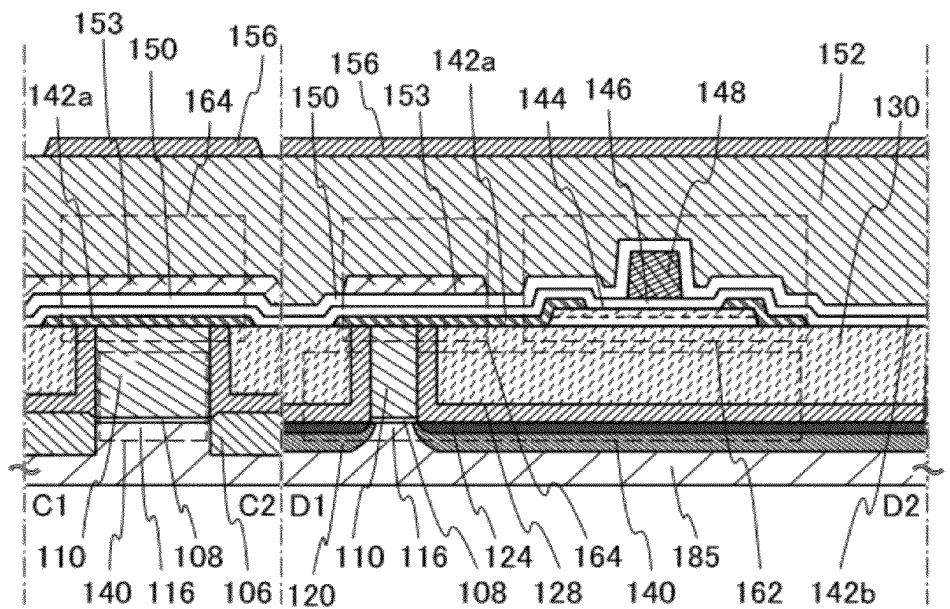
FIGS. 10A to 10C illustrate one mode of a semiconductor device.
Figure 10B:
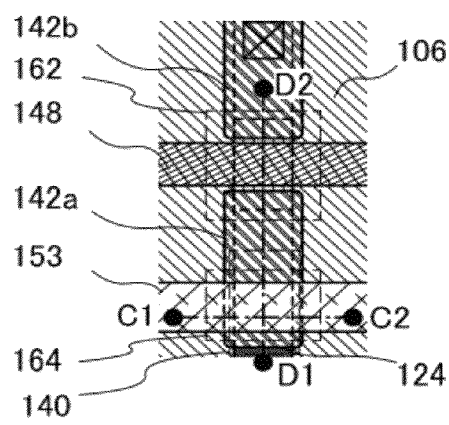
Figure 10C:
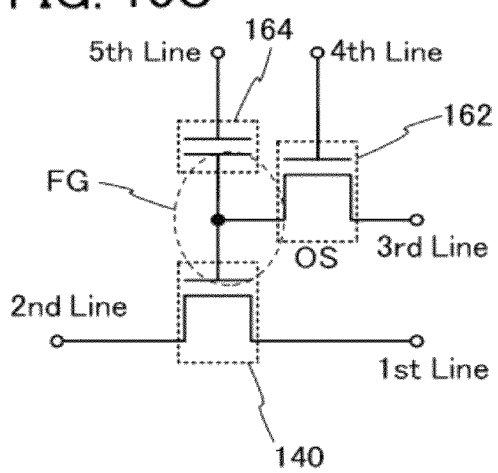

In FIGS. 10A to 10C, an example of the structure of the semiconductor device is illustrated. FIG. 10A illustrates a cross section of the semiconductor device, and FIG. 10B is a top view of the semiconductor device. Here, FIG. 10A corresponds to a cross section along line C1-C2 and line D1-D2 in FIG. 10B. In addition, FIG. 10C is an example of a diagram of a circuit using the semiconductor device as a memory element. The semiconductor device illustrated in FIGS. 10A and 10B includes the transistor 140 using a first semiconductor material in a lower portion, and the transistor 162 using a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, or gallium arsenide can be used, and a single crystal semiconductor is preferably used. Alternatively, an organic semiconductor material or the like may be used. A transistor using such a semiconductor material can operate at high speed easily. On the other hand, a transistor using an oxide semiconductor enables charge to be held for a long time owing to its characteristics.

A method for manufacturing the semiconductor device in FIGS. 10A to 10C is described with reference to FIGS. 10A to 10C.

The transistor 140 includes a channel formation region 116 provided in a substrate 185 containing a semiconductor material (e.g., silicon), impurity regions 120 provided so that the channel formation region 116 is positioned therebetween, metal compound regions 124 in contact with the impurity regions 120, a gate insulating film 108 provided over the channel formation region 116, and a gate electrode 110 provided over the gate insulating film 108.

15379-0329

As the substrate 185 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Although the "SOI substrate" generally means a substrate in which a silicon semiconductor film is provided on an insulating surface, the "SOI substrate" in this specification and the like also includes in its category a substrate in which a semiconductor film formed using a material other than silicon is provided on an insulating surface. That is, a semiconductor film included in the "SOI substrate" is not limited to a silicon semiconductor film. Moreover, the SOI substrate can have a structure in which a semiconductor film is provided over an insulating substrate such as a glass substrate with an insulating film provided therebetween.

As a method of forming the SOI substrate, any of the following methods can be used: a method in which oxygen ions are added to a mirror-polished wafer and then heating is performed thereon at a high temperature, whereby an oxide layer is formed at a certain depth from a top surface of the wafer and a defect caused in the surface layer is eliminated; a method in which a semiconductor substrate is separated by utilizing growth of microvoids formed by hydrogen ion irradiation, by heat treatment; a method in which a single crystal semiconductor film is formed over an insulating surface by crystal growth; and the like.

For example, ions are added through one surface of a single crystal semiconductor substrate, so that an embrittlement layer is formed at a certain depth from a surface of the single crystal semiconductor substrate, and an insulating film is formed over one of the surface of the single crystal semiconductor substrate and an element substrate. Heat treatment is performed in a state where the single crystal semiconductor substrate and the element substrate are bonded to each other with the insulating film provided therebetween, so that a crack is generated in the embrittlement layer and the single crystal semiconductor substrate is separated along the embrittlement layer. Accordingly, a single crystal semiconductor layer, which is separated from the single crystal semiconductor substrate, is formed as a semiconductor layer over the element substrate. An SOI substrate formed by the above method can also be favorably used.

An element isolation insulating layer 106 is provided over the substrate 185 so as to surround the transistor 140. For high integration, it is preferable that, as in FIGS. 10A to 10C, the transistor 140 do not include a sidewall insulating layer. On the other hand, in the case where the characteristics of the transistor 140 have priority, a sidewall insulating layer may be provided on a side surface of the gate electrode 110, and the impurity region 120 including a region having a different impurity concentration may be provided.

The transistor 140 formed using a single crystal semiconductor substrate can operate at high speed. Thus, the use of the transistor as a reading transistor enables data to be read at high speed. Two insulating films are formed so as to cover the transistor 140. As treatment prior to formation of the transistor 162 and a capacitor 164, CMP treatment is performed on the two insulating films, so that an insulating film 128 and an insulating film 130 are formed to be planarized and an upper surface of the gate electrode 110 is exposed.

As each of the insulating film 128 and the insulating film 130, as a typical example, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating film 128 and the insulating film 130 can be formed by a plasma-enhanced CVD method, a sputtering method, or the like.

Alternatively, an organic material such as a polyimide, acrylic, or benzocyclobutene-based resin can be used. Other than such organic materials, it is also possible to use a low dielectric constant material (low-k material) or the like. In the case of using an organic material, the insulating film 128 and the insulating film 130 may be formed by a wet method such as a spin coating method or a printing method.

In the insulating film 130, a silicon oxide film is used as the film to be in contact with the semiconductor film.

In this embodiment, a 50-nm-thick silicon oxynitride film is formed as the insulating film 128 by a sputtering method, and a 550-nm-thick silicon oxide film is formed as the insulating film 130 by a sputtering method.

Over the insulating film 130 which has been sufficiently plarnalized by CMP treatment, oxide semiconductor films having different energy gaps are stacked. In this embodiment, as the stack of oxide semiconductor films, an In—Sn—Zn-based oxide layer and an In—Ga—Zn-based oxide layer are stacked in this order over the insulating film 130 by a sputtering method.

Next, the stack of oxide semiconductor films is selectively etched to form an island-shaped oxide semiconductor stack 144. A source or drain electrode 142a and a source or drain electrode 142b are formed over the oxide semiconductor stack 144.

A gate insulating film 146 and a gate electrode layer 148 are formed over the stack of oxide semiconductor films. The gate electrode layer 148 can be formed by forming a conductive layer and selectively etching the conductive layer.

For the gate insulating film 146, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a gallium oxide film, or an aluminum oxide film can be formed by a plasma-enhanced CVD method, a sputtering method, or the like.

The conductive layers which can be used for the gate electrode layer 148 and the source and drain electrodes 142a and 142b can be formed by a PVD method such as a sputtering method or a CVD method such as a plasma-enhanced CVD method. Further, as a material of the conductive layers, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used.

The conductive layer may have a single-layer structure or a stacked structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. A conductive layer having a single-layer structure of a titanium film or a titanium nitride film has an advantage in that it can be easily processed into the source and drain electrodes 142a and 142b having a tapered shape.

Next, an insulating film 150 is formed over the oxide semiconductor stack 144, the gate insulating film 146, and the gate electrode layer 148. In this embodiment, an aluminum oxide film is used as the insulating film 150.

The aluminum oxide film which is provided as the insulating film 150 over the oxide semiconductor stack 144 has a high blocking effect by which both of oxygen and impurities such as hydrogen or moisture is prevented from being passed through the film.

Therefore, in and after the manufacturing process, the aluminum oxide film functions as a protective film for preventing entry of an impurity such as hydrogen or moisture, which causes a change, into the oxide semiconductor stack 144 and release of oxygen, which is a main constituent material of the oxide semiconductor, from the oxide semiconductor stack 144.

Another insulating film may be stacked over the insulating film 150.

As the insulating film, a silicon oxide film, a silicon nitride film, a silicon oxynitride film, a silicon nitride oxide film, an aluminum nitride film, an aluminum oxide film, an aluminum oxynitride film, an aluminum nitride oxide film, a hafnium oxide film, and a gallium oxide film formed by a plasma-enhanced CVD method, a sputtering method, or the like.

Over the insulating film 150, an electrode layer 153 is formed in a region which overlaps with the source or drain electrode 142a.

Next, an insulating film 152 is formed over the transistor 162 and the electrode layer 153. The insulating film 152 can be formed by a sputtering method, a CVD method, or the like. The insulating film 152 can be formed using a material including an inorganic insulating material such as silicon oxide, silicon oxynitride, silicon nitride, hafnium oxide, or aluminum oxide. Alternatively, an organic material such as polyimide, an acrylic resin, or a benzocyclobutene resin can be used, and a wet process can be used for these organic materials.

Next, an opening reaching the source or drain electrode 142b is formed in the gate insulating film 146, the insulating film 150, and the insulating film 152. The opening is formed by selective etching with the use of a mask or the like.

After that, a wiring 156 is formed in the opening to be in contact with the source or drain electrode 142b. A connection point of the source or drain electrode 142b and the wiring 156 is not illustrated in FIG. 10A.

The wiring 156 is formed in such a manner that a conductive layer is formed by a PVD method such as a sputtering method or a CVD method such as a plasma CVD method and then the conductive layer is etched. Further, as a material of the conductive layers, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used. The details are the same as those of the source or drain electrode 142a.

Through the above steps, the transistor 162 and the capacitor 164 are formed. In this embodiment, the transistor 162 includes the oxide semiconductor stack 144 composed of at least two oxide semiconductor layers having different energy gaps. With the use of the oxide semiconductor stack 144, which is composed of plural oxide semiconductor layers having different energy gaps, as a semiconductor layer, the electric characteristics of the transistor 162 can be accurately controlled; accordingly, desired electric characteristics can be given to the transistor 162. In this embodiment, the oxide semiconductor stack 144 is highly purified and contains excessive oxygen to fill oxygen vacancy. Therefore, the transistor 162 has reduced off-state current and less variation in electric characteristics and is electrically stable. The capacitor 164 includes the source or drain electrode 142a, the oxide semiconductor stack 144, the gate insulating film 146, and the electrode layer 153.

The gate insulating film 146 and the insulating film 150 are stacked in the capacitor 164 in FIGS. 10A to 10C, whereby the insulation between the source or drain electrode 142a and the electrode layer 153 can be sufficiently provided. It is needless to say that the capacitor 164 without the insulating film 150 may be employed in order to secure sufficient capacitance. The capacitor 164 may have a structure including an insulating film. Further alternatively, the capacitor 164 may be omitted in the case where a capacitor is not requisite.

FIG. 10C is an example of a diagram of a circuit using the semiconductor device as a memory element. In FIG. 10C, one of a source electrode and a drain electrode of the transistor 162, one electrode of the capacitor 164, and a gate electrode of the transistor 140 are electrically connected to one another. A first wiring (1st Line, also referred to as a source line) is electrically connected to a source electrode of the transistor 140. A second wiring (2nd Line, also referred to as a bit line) is electrically connected to a drain electrode of the transistor 140. A third wiring (3rd Line, also referred to as a first signal line) is electrically connected to the other of the source electrode and the drain electrode of the transistor 162. A fourth wiring (4th Line, also referred to as a second signal line) is electrically connected to a gate electrode of the transistor 162. A fifth wiring (5th Line, also referred to as a word line) and the other electrode of the capacitor 164 are electrically connected to each other.

The transistor 162 using an oxide semiconductor has extremely low off-state current; therefore, by turning the transistor 162 off, the potential of a node (hereinafter, a node FG) where the one of the source electrode and the drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

To store data in the semiconductor device (in writing of data), the potential of the fourth wiring is set to a potential at which the transistor 162 is turned on, whereby the transistor 162 is turned on. Thus, the potential of the third wiring is supplied to the node FG, so that a predetermined amount of charge is accumulated in the node FG. Here, charge for supplying either of two different potential levels (hereinafter referred to as low-level charge and high-level charge) is given to the node FG. After that, the potential of the fourth wiring is set to a potential at which the transistor 162 is turned off, whereby the transistor 162 is turned off. This makes the node FG floating and the predetermined amount of charge is kept being held in the node FG. The predetermined amount of charge is thus accumulated and held in the node FG, whereby the memory cell can store data.

Since the off-state current of the transistor 162 is controlled to be extremely low, the charge supplied to the node FG is kept being held for a long period. Thus, the refresh operation is not requisite or the frequency of the refresh operation can be extremely reduced, which leads to a sufficient reduction in power consumption. Further, stored data can be kept being held for a long time even when power is not supplied.

To read out stored data (in reading of data), while a predetermined potential (a fixed potential) is supplied to the first wiring, an appropriate potential (a read-out potential) is supplied to the fifth wiring, whereby the transistor 140 changes its state depending on the amount of charge held in the node FG. This is because in general, when the transistor 140 is an n-channel transistor, a threshold value $V_{th\_H}$ of the transistor 140 in the case where the high-level charge is held in the node FG is smaller than a threshold value $V_{th\_L}$ of the transistor 140 in the case where the low-level charge is held in the node FG. Here, each threshold voltage refers to the potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where the high-level electric charge is given in data writing, when the potential of the fifth wiring is $V_0$ ($>V_{th\_L}$), the transistor 140 is turned on. In the case where the low-level electric charge is given in writing, even when the potential of the fifth wiring is $V_0$ ($<V_{th\_L}$), the transistor 140 remains in an off state. Therefore, by controlling the potential of the fifth wiring and determining whether the transistor 140 is in an on state or off state (reading out the potential of the second wiring), stored data can be read out.

Further, in order to rewrite stored data, the next potential is supplied to the node FG that is holding the predetermined amount of charge given in the above data writing, so that the charge of the next data is held in the node FG. Specifically, the potential of the fourth wiring is set to a potential at which the transistor 162 is turned on, whereby the transistor 162 is turned on. The potential of the third wiring (potential of the next data) is supplied to the node FG, and the predetermined amount of charge is accumulated in the node FG. After that, the potential of the fourth wiring is set to a potential at which the transistor 162 is turned off, whereby the transistor 162 is turned off, whereby the charge of the next data is kept being held in the node FG. In other words, while the predetermined amount of charge given in the first writing is kept being held in the node FG, an operation (second writing) is performed in the same manner as the first writing, whereby data can be overwritten to be stored.

The transistor 162 in this embodiment includes the oxide semiconductor stack composed of at least two oxide semiconductor layers having different energy gaps, and the off-state current of the transistor 162 is controlled to be extremely low. By using such a transistor, a semiconductor device in which memory data can be held for an extremely long time can be obtained.

As described above, with the use of the oxide semiconductor stack, which is composed of plural oxide semiconductor layers having different energy gaps, the electric characteristics of the transistor can be accurately controlled; accordingly, desired electric characteristics can be given to the transistor. Therefore, a semiconductor device which meets various purposes such as high performance, high reliability, and low power consumption can be provided.

The methods, structures, and the like described in this embodiment can be combined as appropriate with any of the methods, structures, and the like described in the other embodiments.

Embodiment 7

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment are described. With the semiconductor devices described in the above embodiments, electric devices which meet various purposes such as high performance, high reliability, and low power consumption can be provided.

Figure 11A:
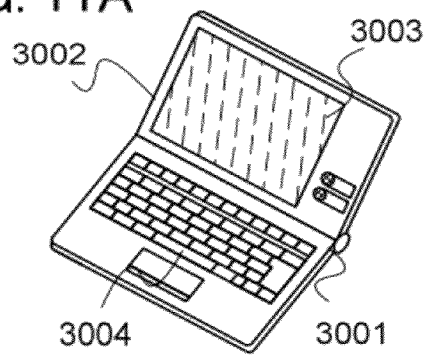
FIGS. 11A to 11F illustrate electronic devices.

FIG. 11A illustrates a laptop personal computer, which includes a main body 3001, a housing 3002, a display portion 3003, a keyboard 3004, and the like. The semiconductor device described in any of Embodiments 1 to 6 is applied to the display portion 3003, whereby a high-performance, highly reliable laptop personal computer can be provided.

Figure 11B:
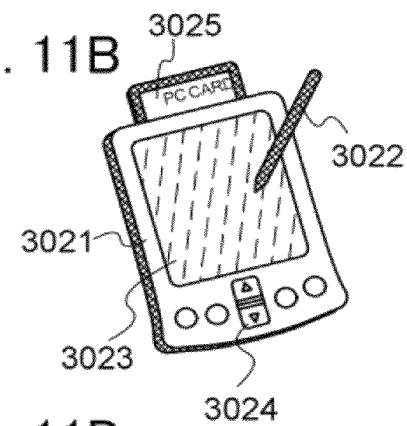

FIG. 11B is a personal digital assistant (PDA) including a display portion 3023, an external interface 3025, an operation button 3024, and the like provided for a main body 3021. A stylus 3022 is included as an accessory for operation. The semiconductor device described in any of Embodiments 1 to 6 is applied to the display portion 3023, whereby a high-performance, highly reliable personal digital assistant (PDA) can be provided.

Figure 11C:
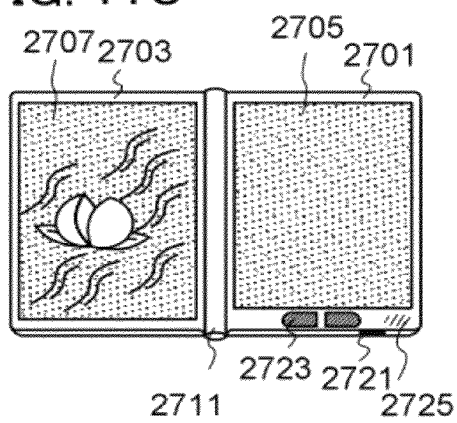

FIG. 11C illustrates an example of an e-book reader. For example, the e-book reader includes two housings, a housing 2701 and a housing 2703. The housing 2701 and the housing 2703 are combined with a hinge 2711 so that the e-book reader can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display images which constitute one screen or plural screens. In the case where the display portion 2705 and the display portion 2707 display images which constitute plural screens, for example, text can be displayed on display portion on the right side (the display portion 2705 in FIG. 11C) and an image/images can be displayed on a display portion on the left side (the display portion 2707 in FIG. 11C). The semiconductor device described in any of Embodiments 1 to 6 is applied to each of the display portion 2705 and the display portion 2707, whereby a high-performance, highly reliable e-book reader can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 11C illustrates an example in which the housing 2701 includes an operation portion and the like. For example, the housing 2701 is provided with a power switch 2721, an operation key 2723, a speaker 2725, and the like. With the operation key 2723, pages can be turned. A keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may be configured to transmit and receive data wirelessly. Through wireless communication, desired book data or the like can be purchased and downloaded from an e-book server.

Figure 11D:
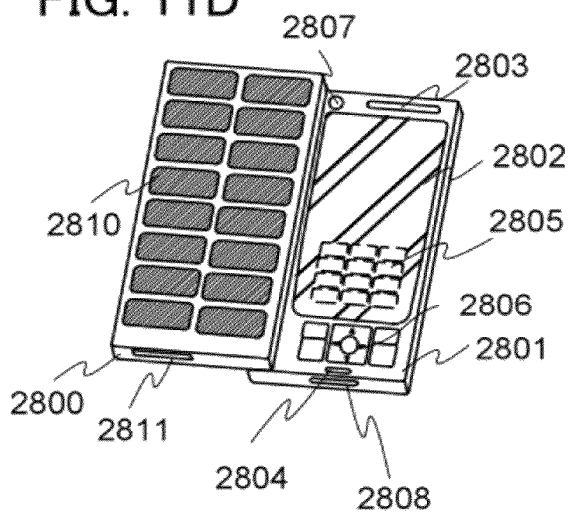

FIG. 11D is a mobile phone, which includes two housings, a housing 2800 and a housing 2801. The housing 2801 is provided with a display panel 2802, a speaker 2803, a microphone 2804, a pointing device 2806, a camera lens 2807, an external connection terminal 2808, and the like. The housing 2800 is provided with a solar cell 2810 for charging the mobile phone, an external memory slot 2811, and the like. Further, an antenna is incorporated in the housing 2801. The semiconductor device described in any of Embodiments 1 to 6 is applied to the display panel 2802, whereby a high-performance, highly reliable mobile phone can be provided.

Further, the display panel 2802 is provided with a touch panel. A plurality of operation keys 2805 which are displayed as images are indicated by dashed lines in FIG. 11D. A boosting circuit by which a voltage output from the solar cell 2810 is increased to be high requisite for each circuit is also provided.

In the display panel 2802, the display direction can be appropriately changed depending on a usage pattern. Further, since the display device is provided with the camera lens 2807 on the same surface as the display panel 2802, a videophone call can be performed. The speaker 2803 and the microphone 2804 can be used for videophone calls, recording and playing sound, and the like as well as voice calls. Furthermore, the housings 2800 and 2801 which are developed as illustrated in FIG. 11D can overlap with each other by sliding; thus, the size of the mobile phone can be decreased to be suitable for being carried.

The external connection terminal 2808 can be connected to an AC adapter and various types of cables such as a USB cable, and charging and data communication with a personal computer are possible. Moreover, a large amount of data can be stored and moved by a storage medium inserted into the external memory slot 2811.

Further, in addition to the above functions, an infrared communication function, a television reception function, or the like may be provided.

Figure 11E:
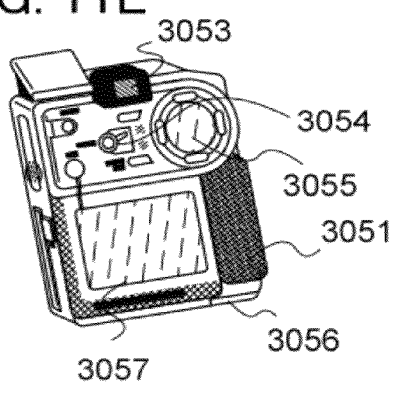

FIG. 11E illustrates a digital video camera which includes a main body 3051, a display portion A 3057, an eyepiece 3053, an operation switch 3054, a display portion B 3055, a battery 3056, and the like. The semiconductor device described in any of Embodiments 1 to 6 is applied to the display portion A 3057 and the display portion B 3055, whereby a high-performance, highly reliable digital video camera can be provided.

Figure 11F:
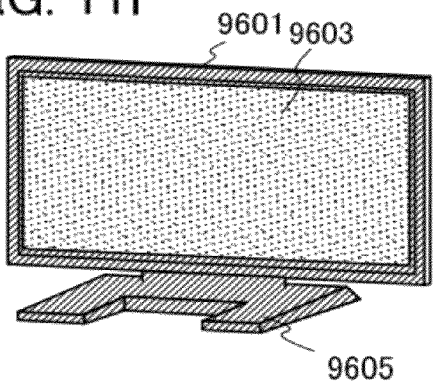

FIG. 11F illustrates an example of a television set. In the television set, a display portion 9603 is incorporated in a housing 9601. Images can be displayed on the display portion 9603. In this structure, the housing 9601 is supported by a stand 9605. The semiconductor device described in any of Embodiments 1 to 6 is applied to the display portion 9603, whereby a high-performance, highly reliable television set can be provided.

The television set can be operated by an operation switch of the housing 9601 or a separate remote controller. Further, the remote controller may be provided with a display portion for displaying data output from the remote controller.

The television set is provided with a receiver, a modem, and the like. With the use of the receiver, general television broadcasting can be received. Moreover, the television set can be connected to a communication network with or without wires via the modem, whereby one-way (from sender to receiver) or two-way (between sender and receiver or between receivers) data communication can be performed.

This embodiment can be implemented in appropriate combination with any of the structures described in the other embodiments.

Example 1

In this example, samples including a first oxide semiconductor layer, a second oxide semiconductor layer with a smaller energy gap than the first oxide semiconductor layer, and a third oxide semiconductor layer, which are stacked in this order, was manufactured; ionization potential of the sample were measured; and the energy band was calculated based on the result and an energy bad diagram was obtained. In this specification, the value of the ionization potential corresponds to the sum of the band gap and the electron affinity, and the value of the band gap is a value obtained by measuring a single material film with an ellipsometer.

As Sample, a 5-nm-thick IGZO film, a 5-nm-thick In—Sn—Zn-based oxide film, and a 5-nm-thick IGZO film were stacked over a single crystal silicon substrate. These films were deposited by a sputtering method at a substrate temperature of 300° C. in an oxygen atmosphere (the proportion of oxygen is 100%). An oxide target having an atomic ratio of In:Ga:Zn=1:1:1 was used as the target to form the IGZO film. Further, an oxide target having an atomic ratio of In:Sn:Zn=2:1:3 was used for the In—Sn—Zn-based oxide film.

Figure 14A:
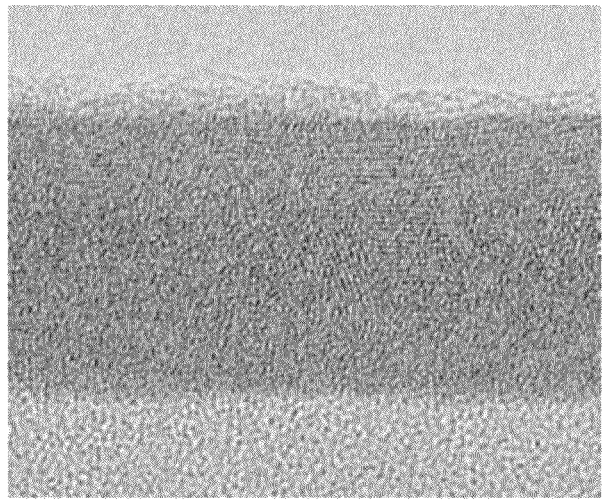
FIGS. 14A and 14B are a TEM image of Sample in Example and a schematic diagram thereof.
Figure 14B:
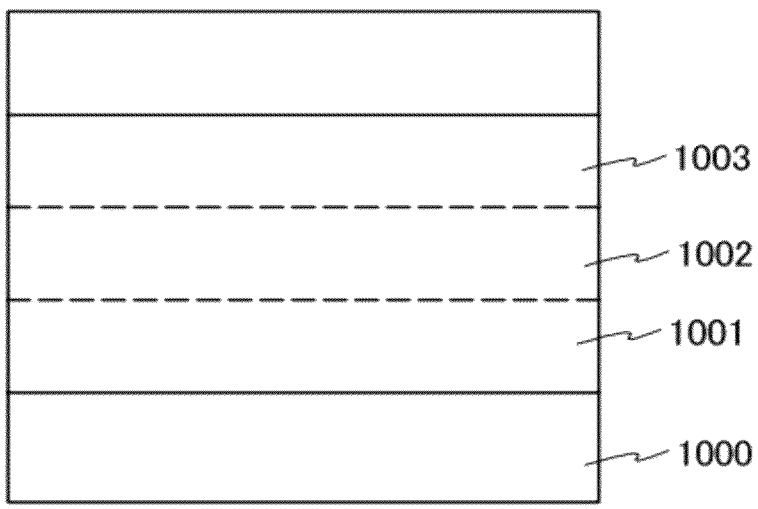

FIG. 14A is a TEM image of a cross-section of Sample obtained by stacking films under the same deposition conditions as the above, with the use of a quartz substrate. Note that a schematic view thereof is illustrated in FIG. 14B. In FIG. 14B, interfaces between the oxide semiconductor layers are schematically denoted by a dotted line. In some cases, the interfaces between the oxide semiconductor layers are unclear depending on the material, the deposition conditions, or heat treatment. Sample shown in FIG. 14A was formed by depositing a 5-nm-thick first IGZO film 1001, a 5-nm-thick In—Sn—Zn-based oxide film 1002, and a 5-nm-thick second IGZO film 1003 to be stacked over a quartz substrate 1000. The interfaces between the IGZO films and the In—Sn—Zn-based oxide film can be observed. Further, from FIG. 14A, crystals can be observed in the second IGZO film 1003 and the In—Sn—Zn-based oxide film 1002, and the second IGZO film 1003 and the In—Sn—Zn-based oxide film 1002 are a c-axis aligned crystal oxide semiconductor (CAAC-OS) film. In addition, from FIG. 14A, the first IGZO film 1001 has an amorphous structure. Note that in FIG. 14A, two out of the three layers are oxide semiconductor films having a crystalline structure; however, the structure of the oxide semiconductor stack is not limited thereto. Only the second IGZO film 1003 may have a crystalline structure, or all of the three layers may have an amorphous structure.

Ionization potential was measured by ultraviolet photoelectron spectroscopy (UPS) while Sample was sputtered from a surface side of Sample. The measurement result is shown in FIG. 12.

Figure 12:
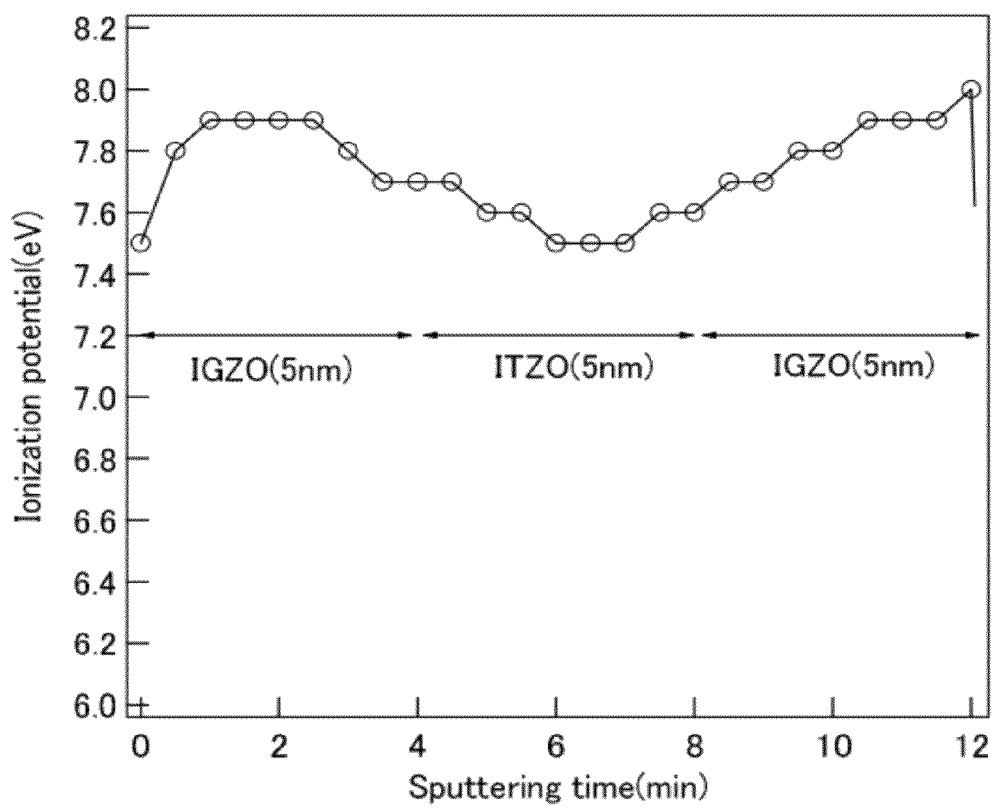
FIG. 12 is a graph showing the ionization potential.

In FIG. 12, the horizontal axis indicates the time of sputtering conducted from the surface side of Sample and the vertical axis indicates the ionization potential. Borders between the films are indicated on the assumption that the sputtering rate of the IGZO film is equal to that of the In—Sn—Zn-based oxide film. From FIG. 12, the ionization potential of the In—Sn—Zn-based oxide film which was sandwiched between the IGZO films is lowered. Note that ionization potential corresponds to energy difference between a vacuum level and valence band.

Figure 13:
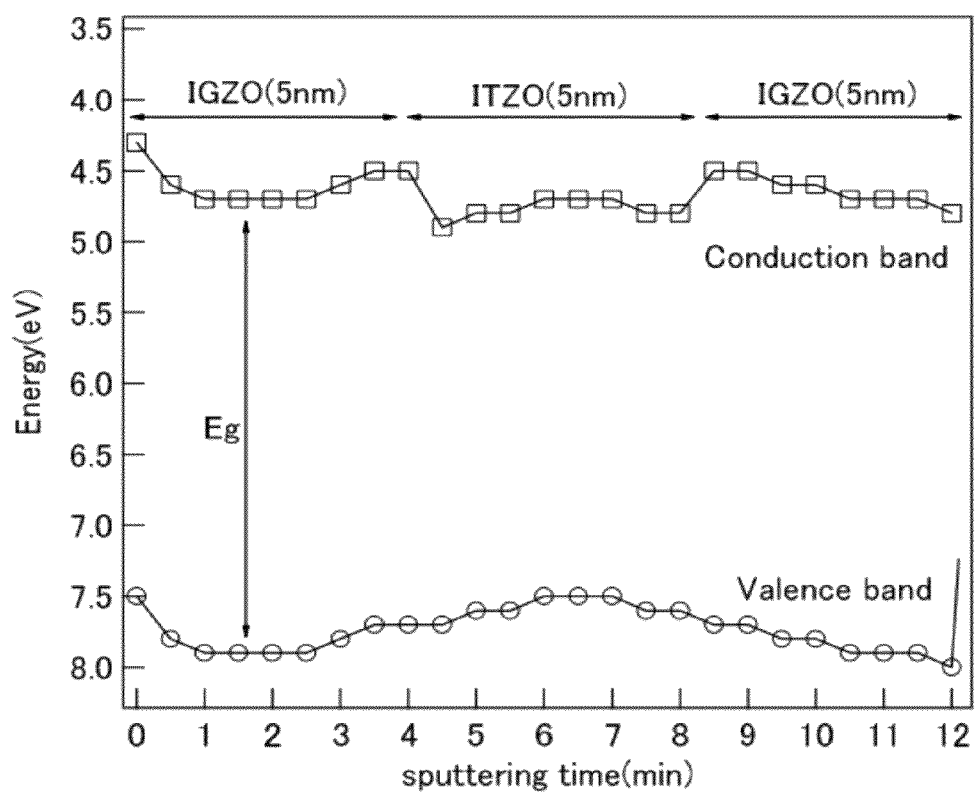
FIG. 13 is an energy band diagram.

The energy of the conduction band was obtained by subtracting the band gap measured by an ellipsometer from the value of the ionization potential, and the band structure of the stacked films was formed. Note that the band gap of the IGZO film was 3.2 eV, and the band gap of the In—Sn—Zn-based oxide film was 2.8 eV. FIG. 13 shows the result. FIG. 13 indicates that a buried channel is formed as in the case of the energy band diagram of FIG. 4C.

According to this example, as an energy band diagram, FIG. 13 or FIG. 4C can be applied to the stack in which IGZO films are used for the first oxide semiconductor layer and the third oxide semiconductor layer, and an In—Sn—Zn-based oxide film is used for the second oxide semiconductor layer having higher ionization potential and smaller energy gap than the first oxide semiconductor layer and the third oxide semiconductor layer. The combination of materials of the first oxide semiconductor layer, the second oxide semiconductor layer, and the third oxide semiconductor layer are not particularly limited, and in consideration of energy gap of materials to be used, the materials may be appropriately selected and combined by practitioners in order to satisfy the energy band diagram shown in FIG. 13 or FIG. 4C. For example, a stacked structure in which IGZO films are used for the first oxide semiconductor layer and the third oxide semiconductor layer and an indium zinc oxide film is used for the second oxide semiconductor layer may be used.

This application is based on Japanese Patent Application serial no. 2011-135355 filed with Japan Patent Office on Jun. 17, 2011, the entire contents of which are hereby incorporated by reference.

What is claimed is:

1. A semiconductor device comprising:
    an oxide semiconductor stack comprising a first oxide semiconductor layer and a second oxide semiconductor layer;
    a source electrode layer and a drain electrode layer over the oxide semiconductor stack;
    an insulating film over the oxide semiconductor stack; and
    a gate electrode layer over the insulating film, the gate electrode layer overlapping with the oxide semiconductor stack,
    wherein energy gaps of the first oxide semiconductor layer and the second oxide semiconductor layer are different from each other,
    wherein the oxide semiconductor stack includes a first region, a second region, a third region, a fourth region, and a fifth region,
    wherein the gate electrode layer overlaps the first region,
    wherein the source electrode layer is in contact with the second region,
    wherein the drain electrode layer is in contact with the third region,
    wherein the fourth region and the fifth region are not overlapped by any of the gate electrode layer, the source electrode layer, and the drain electrode layer,
    wherein an impurity concentration of the fourth region is higher than that of the second region, and
    wherein an impurity concentration of the fifth region is higher than that of the third region.

2. The semiconductor device according to claim 1, wherein the second oxide semiconductor layer is in contact with the insulating film.

3. The semiconductor device according to claim 1, wherein the first region is a channel formation region.

4. A semiconductor device comprising:
an oxide semiconductor stack comprising a first oxide semiconductor layer, a second oxide semiconductor layer, and a third oxide semiconductor layer;
a source electrode layer and a drain electrode layer over the oxide semiconductor stack;
an insulating film over the source electrode layer and the drain electrode layer; and
a gate electrode layer over the insulating film, the gate electrode layer overlapping with the oxide semiconductor stack,
wherein the second oxide semiconductor layer is interposed between the first oxide semiconductor layer and the third oxide semiconductor layer, and
wherein an energy gap of the second oxide semiconductor layer is smaller than energy gaps of the first oxide semiconductor layer and the third oxide semiconductor layer.

5. The semiconductor device according to claim 4, wherein the first oxide semiconductor layer, the second oxide semiconductor layer, and the third oxide semiconductor layer are in contact with the source electrode layer and the drain electrode layer.

6. The semiconductor device according to claim 4, wherein the third oxide semiconductor layer is in contact with the insulating film.

7. The semiconductor device according to claim 4,
wherein the oxide semiconductor stack includes a first region, a second region, a third region, a fourth region, and a fifth region,
wherein the gate electrode layer overlaps the first region,
wherein the source electrode layer overlaps the second region,
wherein the drain electrode layer overlaps the third region,
wherein the fourth region and the fifth region are not overlapped by any of the gate electrode layer, the source electrode layer, and the drain electrode layer.

8. The semiconductor device according to claim 7, wherein the first region is a channel formation region.

9. The semiconductor device according to claim 7,
wherein an impurity concentration of the fourth region is higher than that of the second region, and
wherein an impurity concentration of the fifth region is higher than that of the third region.

10. The semiconductor device according to claim 4,
wherein the energy gaps of the first oxide semiconductor layer and the third oxide semiconductor layer are substantially the same.

11. The semiconductor device according to claim 4, wherein an electron affinity of the second oxide semiconductor layer is higher than electron affinities of the first oxide semiconductor layer and the third oxide semiconductor layer.

12. The semiconductor device according to claim 1,
wherein an energy gap of the first oxide semiconductor layer is smaller than 3.0 eV, and
wherein an energy gap of the second oxide semiconductor layer is larger than 3.0 eV.

13. The semiconductor device according to claim 4,
wherein the energy gaps of the first oxide semiconductor layer and the third oxide semiconductor layer are larger than 3.0 eV, and
wherein the energy gap of the second oxide semiconductor layer is smaller than 3.0 eV.

14. A semiconductor device comprising:
an oxide semiconductor stack comprising a first oxide semiconductor layer and a second oxide semiconductor layer;
a first wiring and a second wiring electrically connected to the oxide semiconductor stack;
an insulating film over the oxide semiconductor stack; and
a gate electrode layer over the oxide semiconductor stack with the insulating film therebetween,
wherein energy gaps of the first oxide semiconductor layer and the second oxide semiconductor layer are different from each other,
wherein the oxide semiconductor stack includes a first region, a second region, a third region, a fourth region, and a fifth region,
wherein the gate electrode layer overlaps the first region,
wherein the first wiring is in contact with the second region,
wherein the second wiring is in contact with the third region,
wherein the fourth region and the fifth region are not overlapped by any of the gate electrode layer, the first wiring, and the second wiring,
wherein an impurity concentration of the fourth region is higher than that of the second region, and
wherein an impurity concentration of the fifth region is higher than that of the third region.

15. The semiconductor device according to claim 14, wherein the first region is a channel formation region.

16. The semiconductor device according to claim 14,
wherein an energy gap of the first oxide semiconductor layer is smaller than 3.0 eV, and
wherein an energy gap of the second oxide semiconductor layer is larger than 3.0 eV.

* * * * *